United States Patent
Skovenborg

(10) Patent No.: US 9,565,508 B1
(45) Date of Patent: Feb. 7, 2017

(54) LOUDNESS LEVEL AND RANGE PROCESSING

(71) Applicant: The TC Group A/S, Risskov (DK)

(72) Inventor: Esben Skovenborg, Aarhus C (DK)

(73) Assignee: MUSIC GROUP IP LTD., Tortola (VG)

( * ) Notice: Subject to any disclaimer, the term of this patent is extended or adjusted under 35 U.S.C. 154(b) by 423 days.

(21) Appl. No.: 14/020,185

(22) Filed: Sep. 6, 2013

Related U.S. Application Data

(60) Provisional application No. 61/697,949, filed on Sep. 7, 2012.

(51) Int. Cl.
*H03G 3/00* (2006.01)
*H04S 3/00* (2006.01)

(52) U.S. Cl.
CPC .................... *H04S 3/006* (2013.01)

(58) Field of Classification Search
CPC ..... H04R 2430/01; H04R 25/00; H04R 25/70; H04R 29/00; H04R 3/04; H04R 5/04; H04R 25/50; H04R 3/002; H04R 1/10; H04R 2420/07; H04R 2430/03; H04R 25/305; H04R 3/00; H04R 1/1016; H04R 1/1041
USPC ...... 381/103–107, 56–58, 98; 704/224, 225; 700/94
See application file for complete search history.

(56) References Cited

U.S. PATENT DOCUMENTS

| 5,812,969 A | * | 9/1998 | Barber, Jr. | .......... | G10L 21/0364 |
| | | | | | 704/224 |
| 8,428,758 B2 | * | 4/2013 | Naik | ....................... | G10L 21/00 |
| | | | | | 381/107 |
| 2008/0095385 A1 | * | 4/2008 | Tourwe | .................. | H03G 7/007 |
| | | | | | 381/107 |
| 2013/0272543 A1 | * | 10/2013 | Tracey | ..................... | H03G 3/32 |
| | | | | | 381/107 |
| 2014/0037098 A1 | * | 2/2014 | Mauger | ................ | H04R 25/554 |
| | | | | | 381/60 |
| 2014/0044268 A1 | * | 2/2014 | Herberger | ................ | H03G 3/20 |
| | | | | | 381/56 |

OTHER PUBLICATIONS

Hauenstein M., A Computationally Efficient Alqorithm for Calculating Loudness Patterns of Narrowband Speech (Acoustics, Speech and Signal Processing, 1997 ICASSP-97 IEEE International Conference on Munich, Germany Apr. 21-24, 1997, Los Alamitos, CA, IEEE Comput. Soc., US, Apr. 21, 1997, pp. 1311-1314).*

* cited by examiner

*Primary Examiner* — Lun-See Lao
(74) *Attorney, Agent, or Firm* — Cantor Colburn LLP

(57) ABSTRACT

Loudness signal processors and methods for processing an input audio signal in order to control a resulting integrated loudness level and a resulting loudness range of an output audio signal by a predetermined target loudness level and by a predetermined target loudness range, the processors and methods comprising level detection and level distribution analysis; transfer function generation based on the level distribution, the predetermined target loudness level and the predetermined target loudness range; and calculation of a gain to apply to said input audio signal, resulting in said output audio signal.

43 Claims, 11 Drawing Sheets

LOUDNESS LEVEL AND RANGE PROCESSING

CROSS-REFERENCE TO RELATED APPLICATION

This application is related to and claims the benefit of U.S. provisional application Ser. No. 61/697,949 filed on 7 Sep. 2012, the contents of which are herein incorporated by reference in their entirety.

FIELD OF THE INVENTION

The present invention relates to a real-time signal processor capable of determining and applying a time-varying gain to an input audio signal, such that an estimated loudness level and an estimated loudness range of the output signal are normalized/limited according to given target parameters.

BACKGROUND

In many applications it is desirable to automatically control the level of an audio signal. Traditionally, such an audio signal processor is known as an automatic gain control (AGC), compressor, or limiter. A special type of such signal processors contains a (simple) estimator of loudness level, such that the processor attempts to control the level in a way that corresponds to the perceived loudness of the signal. Certain existing processors can perform level detection based on an RMS level—which may be considered a primitive loudness level estimator.

Some pre-existing dynamic range compressors can operate in real-time. That is, the processed (output) signal is generated 'immediately', typically meaning with a delay—due to the processing itself and the platform on which it is implemented—of a few seconds or less. Such processors have no knowledge or 'model' of the content which they are processing. By setting the controls of such processors, the user must specify directly the parameters of the actual processing. For instance, a "threshold" parameter is typically used to specify an absolute level, above which the material should be compressed, and a "ratio" parameter specifies how much the levels above the threshold should be compressed, and finally a "makeup gain" specifies a gain to be applied, in order to amplify the output level by a predetermined amount. All such parameters describe the specific processing to be performed—not taking into account any property of the actual content to be processed.

Figure 1:
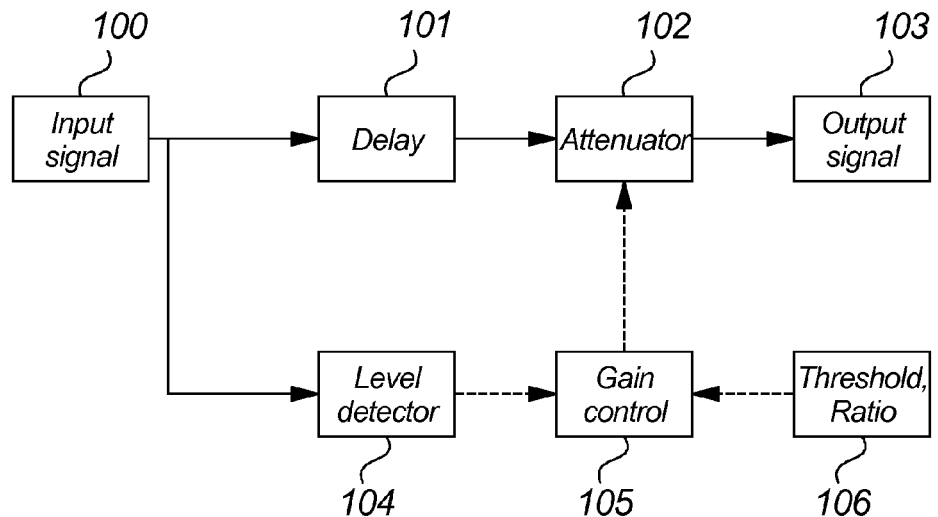
Figure 4:
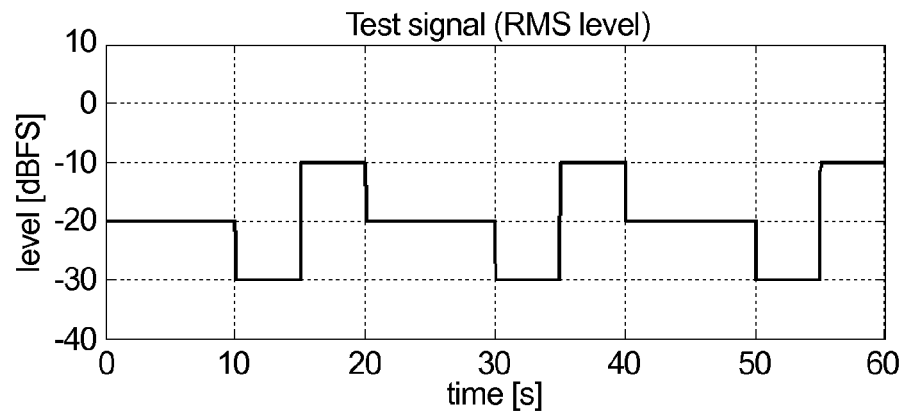

FIG. 1 shows the blocks diagram of a typical prior art dynamic-range compressor. In Zölzer's "DAFx–Digital Audio Effects" (Wiley, 2011) the technical details of several variations of such processors are provided. In FIG. 1 the Level detector block (104) may implement a 1$^{st}$ order IIR-based RMS measurement (Zölzer, FIG. 4.10). The Delay block (101) provides so-called look-ahead delay, which serves to time-align the audio signal with the control signal from the side-chain. The Gain control block (105) calculates an attenuation gain value, based on the output from the Level detector (104) and a given threshold level and compression ratio (106). The Attenuator block (102) then multiplies the signal amplitude with the attenuation gain.

A different type of pre-existing dynamic range compressors operate according to the "2-pass method", and can process stored content such as sound files. Such processors first analyze the content (pass 1), and measure various properties of the material, such as overall level and dynamic range (or level "spread"). After completing pass 1, such processors will then carry out pass 2, in which they will perform the actual processing, and typically generate an output sound file. In contrast to the pre-existing real-time processors, the 2-pass processors may take into account various properties of the content (measured in pass 1), while setting up the processing (taking place in pass 2). Thus, the parameters of such processors may specify desired properties of the processed (output) signal, rather than properties of the processing itself. For example, a target loudness level may be specified, and the 2-pass processor would then set, for example, its "makeup gain" such that the overall loudness level of the processed sound file would match the specified target.

Loudness control processing has become increasingly relevant in the past decade. In broadcasts in radio/TV and other media, regulations may require that the programme itself—or commercials within/between programmes—must not exceed a certain loudness level and/or range. Both international and national standards and recommendations have been published in recent years, specifying and supporting such regulations, by organizations including ITU-R, EBU, ATSC, and BCAP.

The only ways to comply with such regulations have involved storing the entire programme as a file, and using a 2-pass processor. Even such processors are typically capable of matching only the target loudness level—not a target loudness level and a target loudness range. Or alternatively, real-time processing might be required, such as in a live production or broadcast transmission. In this case, a skilled operator would need to be present to setup the processing parameters according to his knowledge of the material to be processed. He would then often use a loudness meter, in order to check properties of the processed signal, and possibly adjust the processing parameters. In any case a time-consuming process and/or an extended work-flow.

SUMMARY OF THE INVENTION

The present invention relates to a loudness signal processor for processing an input audio signal in order to control a resulting integrated loudness level and a resulting loudness range of an output audio signal by a predetermined target loudness level and by a predetermined target loudness range, the loudness signal processor comprising an input arranged to receive an input audio signal; a level detector block arranged to determine a time-varying level of said input audio signal; a distribution analyzer block arranged to estimate a time-varying level distribution of said time-varying level; a transfer function generator block arranged to determine a time-varying transfer function on the basis of said time-varying level distribution, and said predetermined target loudness level and said predetermined target loudness range; a gain control block arranged to calculate a time-varying gain on the basis of said time-varying level of the input audio signal and said time-varying transfer function; a multiplier block arranged to apply said time-varying gain to said input audio signal, resulting in said output audio signal.

By 'predetermined' as in predetermined target loudness level, is referred to a parameter which may be determined at any point in time, for instance by the user, by available meta-data, by the signal source, and/or by the programme genre/channel. Once the parameter has been determined it remains constant until next time it is determined.

By 'integrated', as in integrated loudness level, is referred to the overall loudness level of a certain period of the signal, typically a duration from some seconds to several hours. The 'integrated' does not imply that this loudness level must be the result of a (mathematical) integration. The 'integrated loudness level' is in contrast to the "time-varying (loudness) level" which—even though it may also be calculated as an integration—typically covers a smaller period of the signal, typically from (say) 50 ms to (say) 5 seconds, and refers to a different element of the present invention.

By 'multiplier', as in multiplier block, is referred to a function capable of attenuating and/or amplifying the signal as determined by its time-varying gain input control signal.

In a preferred embodiment of the loudness signal processor of the present invention, continuous non-parametric statistical signal analysis—based dynamics processing is used to control loudness level and loudness range of an audio signal in real time.

The present invention is extremely useful as it is directly applicable—i.e. not requiring pre-analysis or meta data—in all audio processing applications, such as live shows and live sport events on TV or radio, broadcast of pre-produced programs, music recordings, playback of CDs or mp3-files, live streaming of audio over mobile phone networks, computer networks or the Internet, etc. Also outside the broadcasting/audio distribution frameworks may the present invention be useful, e.g. for controlling loudness for improving live voice communication channels, e.g. by telephone, voice-over-IP, satellite, radio, etc., with potentially great improvements for e.g. air traffic communication, rescue—or security operations, public address systems, and even every-day telephone conversation, etc. Live performance of music or theater is another application where there are certain, established requirements for both the overall loudness and the loudness range. In other words, for basically any real-time audio application where frequent volume adjustments are required and/or audio level dissatisfaction is a frequent phenomenon, the loudness processor of the present invention could be useful.

According to the present invention, the predetermined target loudness level and target loudness range effectively describe the desired properties of the processed signal (output signal), without the need to specify the parameters of the actual processing required to obtain the desired output (as opposed to conventional dynamic compressors). Thus, the same target loudness level and/or range may be employed with different signals or programmes which require different dynamic processing in order to meet the targets.

According to the present invention, the loudness signal processor may effectively perform dynamic compression, dynamic expansion, and/or simply an overall gain alignment, depending on the properties of the input audio signal, on the predetermined target loudness parameters, and on the particular type of Transfer Function Generator.

According to the present invention, the loudness signal processor may perform real-time processing with essentially no processing latency. In practice this works because the dynamic properties and loudness properties of the input signal may be assumed to be quasi-stationary. In other words, the loudness processor assumes that the parameters estimated based on the level distribution also apply to the "near-future" input signal. Thus, the only processing latency of the output signal is that of the Gain Control block, which may be similar to the latency of conventional real-time dynamic compressors.

According to the present invention, the loudness signal processor may adapt to the dynamic and loudness properties of virtually any program content, without receiving any prior analysis or meta-data regarding the particular input signal.

An advantageous embodiment of the present invention is obtained when said distribution analyzer block is arranged to estimate said time-varying level distribution on the basis of a part of said input audio signal by considering values of said time-varying level corresponding to different times with two or more different weights.

When estimating the time-varying level distribution, the distribution analyzer in a preferred embodiment considers only levels of a part of the input audio signal. The considered part may be the entire elapsed part of the input audio signal, or a fixed or variable time window thereof. In an embodiment, the levels determined at different times are, however, considered with different weights, for example to control how significant an extreme level determined at a certain time will be considered at different certain later times, e.g. soon after and long after. In an embodiment where all levels determined within a window of a certain time span are desired to be considered with equal significance, e.g. running histogram-like distribution estimation, this effectively means that a weight of zero is applied to levels outside that window, thus making the number of used weights two. In an embodiment where all or most levels determined during elapsed time of the input audio signal are desired to be considered, however the older, the less significant, e.g. a recursive-type of distribution estimation, this implicitly means that a multitude of different weights are applied.

In other words, in a preferred embodiment, past determined levels will be considered with a decreased significance at some time, the options comprising at one extreme the simple two steps of either full consideration or zero consideration, or different varieties of degrading consideration with the age of the past level down to and including or not including zero consideration.

An advantageous embodiment of the present invention is obtained when said distribution analyzer block is arranged to estimate said time-varying level distribution of said time-varying level by means of a finite-length sliding window.

The length of the sliding window of the distribution analyzer determines the duration of the 'history' considered by the processor. The user may adjust the length of the sliding window, and thus adjust how quickly the processor will adapt its processing to the input.

An advantageous embodiment of the present invention is obtained when said distribution analyzer block is arranged to estimate said time-varying level distribution of said time-varying level by means of a set of IIR filters.

The IIR filters might be of a "leaky integrator" type. In this embodiment the feedback coefficients or time-constants of the filters would conceptually substitute the window-length parameter of the sliding-window distribution analyzer.

An advantageous embodiment of the present invention is obtained when said distribution analyzer block is arranged to estimate the time-varying level distribution of said time-varying level to which said time-varying transfer function has been applied, thus effectively estimate a distribution of a level of said output audio signal.

By obtaining an estimate of the output level during the processing the possibility to ensure compliance with specific output signal level requirements or standards may in some embodiments be improved. In a preferred embodiment, this may be implemented by allowing bidirectional data flow between the distribution analyzer block and the transfer generator block, e.g. by making the time-varying transfer function a data structure available for both blocks.

An advantageous embodiment of the present invention is obtained when said distribution analyzer block is arranged to maintain at least two instances, one weighing the older time-varying levels lower than the other instance in their respective distribution estimates.

In other words, the distribution analyzer establishes and updates two distributions, whereof one instance takes the farther history more into account than the other instance. For example, a sliding-window distribution analyzer having one distribution instance with a 5 s window-length, and another distribution instance with a 60 s window-length.

The transfer function generator, receiving both the 'shorter' and the 'longer' distribution estimates, may employ both distributions to generate a better transfer function than would have been possible with either one of the distributions alone. For example, the transfer function generator may apply either the shorter or the longer distribution, in determining the degree of compression implemented in the transfer function, by choosing the distribution which would cause the higher degree of compression, i.e. a conservative transfer function generator.

This feature may also make a trade-off between too long vs. too short distribution analyzer window (or equivalent for an IIR-based distribution analyzer) less critical to the resulting transfer function generator.

An advantageous embodiment of the present invention is obtained when an estimated integrated loudness level over a finite-length window of the output audio signal substantially matches said predetermined target loudness level.

The loudness signal processor applies attenuation gain or amplification gain as estimated in order to match the desired target loudness level. When the dynamic properties of the input signal are generally stationary, relative to the length of the sliding window, then the loudness level match will tend to be accurate.

An advantageous embodiment of the present invention is obtained when an estimated integrated loudness level over a finite-length window of the output audio signal is substantially constrained by said predetermined target loudness level.

The loudness signal processor applies attenuation gain when the estimated loudness level of the input signal is too high, compared to the target loudness level, but merely applies unity gain when the input is too soft. For certain genres of material this type of processing may be preferable.

An advantageous embodiment of the present invention is obtained when an estimated loudness range over a finite-length window of the output audio signal substantially matches said predetermined target loudness range.

An advantageous embodiment of the present invention is obtained when an estimated loudness range over a finite-length window of the output audio signal is substantially constrained by said predetermined target loudness range.

The loudness signal processor applies dynamic compression when the estimated loudness range of the input signal is too high, compared to the target loudness range, but does not apply dynamic expansion when the input is already too compressed. This type of processing may be preferable because applying dynamic expansion to material which is already too compressed does not in general 'undo' the compression.

An advantageous embodiment of the present invention is obtained when said predetermined target loudness level is specified as a value of the integrated, gated loudness level, as standardized in ITU-R BS.1770-2 and EBU R-128.

An advantageous embodiment of the present invention is obtained when said predetermined target loudness range is specified as a value of the LRA measure, as standardized in EBU Tech. Doc. 3342 and EBU R-128.

The invention may be employed to process a broadcast programme, and hence ensure that the programme complies with standards, recommendations or guidelines that specify typically a target loudness level and a maximum loudness range. Post-processing as well as transmission applications may benefit from having the loudness processor of the present invention inserted into the signal chain.

An advantageous embodiment of the present invention is obtained when said level detector block is arranged to determine said time-varying level of said input audio signal by performing RMS calculation of the input audio signal.

The level detector may perform an RMS calculation of the input signal as a moving average (i.e. a FIR filter), where the energy within each window can be calculated as the sum of squared samples contained within the window. Alternatively, the level detector block may employ an IIR filter.

An advantageous embodiment of the present invention is obtained when the time-varying level of said input audio signal corresponds to an estimate of a time-varying loudness level of said input audio signal.

Estimating a loudness level of the input audio signal facilitates determining the distribution of time-varying loudness levels directly by the distribution analyzer block.

An advantageous embodiment of the present invention is obtained when said distribution analyzer block is arranged to enable re-initialization.

Re-initialization may for example be beneficial at the beginning of a new programme, such that the levels received prior to the new programme are discarded from the distribution.

An advantageous embodiment of the present invention is obtained when said distribution analyzer block comprises a priming with a predetermined level distribution, the priming being effective immediately.

The distribution analyzer may according to this embodiment be primed with a predetermined level distribution in the sense that it is re-initialized with values or into a state which was determined previously, either by measurement (of some signal) or by design (e.g. based on analytical properties).

The loudness processor may start processing a signal, based on a level distribution which was measured or estimated earlier and stored. Such "preset distributions" may be characteristic for a particular genre of programme, or for a particular source or content provider. Even though the distribution is in this case not (initially) based on the actual input signal, the effective transfer function may correspond well to the input signal, if an appropriate preset distribution was chosen. In a preferred embodiment, the influence of the preset distribution or a simple zero start-distribution on the time-varying level distribution will decrease over time, e.g. in an amount of time corresponding to the window length in an embodiment employing a finite sliding window. In other words, the predetermined level distribution only plays a role in the beginning of a program, according to a preferred embodiment of the invention, but it may on the other hand be a quite important role during that time.

The predetermined target parameters may be set independently of the particular "preset distribution" (if any), and may be set in any order and at any time.

An advantageous embodiment of the present invention is obtained when said distribution analyzer block comprises a priming with a predetermined level distribution, the priming being effective at a specific relative or absolute time.

The loudness processor may apply a level distribution, stored previously, starting at a specified time in the future. For instance, a playout server may know in advance when the next programme begins, and may be able to communicate this information to a loudness signal processor of the present invention. Alternatively, meta-data may specify the type, genre, or status of the audio content, to be processed. For example, meta-data may specify whether the material has already been processed or not. The meta-data may be supplied merged with the input audio signal itself, or may be supplied separately, either synchronously or asynchronously.

An advantageous embodiment of the present invention is obtained when said distribution analyzer block comprises a priming with a predetermined level distribution and is arranged to, over time, update the predetermined level distribution based on said time-varying level of the input audio signal.

When the loudness processor applies a level distribution, stored previously, the distribution analyzer may still estimate the time-varying level distribution of the input signal. The level distribution that the Transfer Function Generator bases its optimization on may then be some combination of the stored/preset distribution and the continually estimated distribution. The Distribution Analyzer may 'morph' from one distribution to the other.

According to an advanced embodiment, the Distribution Analyzer may employ a statistical measure of stability to the time-varying distribution, and hence assign a greater weight to the time-varying distribution when it appears to be stable, and—correspondingly—assign a greater weight to the preset distribution, otherwise.

An advantageous embodiment of the present invention is obtained when said distribution analyzer block comprises a priming with a predetermined level distribution and is arranged to, over time, update the predetermined level distribution based on said time-varying level of the input audio signal; wherein two or more predetermined level distributions are stored, each being associated with a certain audio signal type; and wherein the distribution analyzer block is arranged to perform the update only for a predetermined level distribution which is associated with an audio signal type corresponding to a type of the input audio signal.

Thereby is achieved that each stored, predetermined level distribution is recurrently updated only based on time-varying audio levels from a certain kind of input audio signal. The audio signal type may be, for instance, the genre of the audio signal, the signal source or provider, or any metadata suitable for determining loudness processing properties. Thus, a distribution analyzer may comprise a predetermined level distribution associated with e.g. the genre 'Talk show', and only update that distribution based on levels obtained during a talk show, and thereby may improve the loudness processing of subsequent Talk shows. The analyzer may likewise comprise a predetermined level distribution associated with e.g. the genre 'Music', which is applied and updated only when the input audio signal is of the music genre.

An advantageous embodiment of the present invention is obtained when said distribution analyzer block comprises a priming with a predetermined level distribution; and wherein the loudness signal processor is arranged to let the predetermined level distribution predominantly affect the target loudness range properties of said time-varying transfer function, and the time-varying level distribution predominantly affect the target loudness level properties of said time-varying transfer function.

This could be advantageous, because a reasonably accurate estimate of the integrated loudness level of the input signal may be more readily obtained (e.g. analyzing a shorter part of a program) than a good estimate of the input loudness range. Thus, if the predetermined distribution provides a decent match with the (actual) input loudness range, then this distribution may be preferable to the estimate based on the input level, especially, for a certain period after the distribution analyzer has been re-initialized. The mixing of predetermined level distribution and time-varying level distribution may be carried out in the distribution analyzer block, in which case it blends the two distributions into one time-varying level distribution according to the above or other schemes, and passes it to the transfer function generator block. Alternatively, both or more level distributions may be received by the transfer function generator block to let it decide on the mixing and morphing between the relevant distributions.

An advantageous embodiment of the present invention is obtained when said distribution analyzer block comprises a priming with a predetermined level distribution which has been generated in advance based on a collection of programs belonging to the same audio signal type that have first been loudness normalized individually, then their time-varying levels measured forming individual level distributions, and then all these distributions combined into the predetermined distribution to be used for priming.

An advantageous embodiment of the present invention is obtained when a time-delay block is arranged to delay the input audio signal.

In this embodiment a "look-ahead delay" is included in the Loudness Processor, which continually gives the Distribution Analyzer and Transfer Function Analyzer blocks a limited amount of time to analyze the input signal, before the same part of the signal needs to be processed by the Multiplier block.

Effectively, this look-ahead means that not only past levels but also 'future' levels—up to the length of the delay—may contribute to the distribution. Thereby the resulting distribution estimate may adapt to a given change of the input signal while it is occurring—rather than after.

According to a further embodiment of the invention, the Transfer Function Generator may determine its initial estimates of integrated loudness level on the level distribution of the input signal, because the look-ahead may enable a reasonably accurate estimate even before processing the (delayed) signal begins. The Transfer Function Generator may furthermore determine its initial estimates of loudness range based on the 'preset' level distribution, because an accurate estimate of the loudness range would require more input samples. Thus, an appropriate processing is possible even from the beginning of a programme, the dynamic properties of which is similar to the 'preset', but which may have a level offset compared to the preset distribution.

An advantageous embodiment of the present invention is obtained when the length of the finite-length sliding window of said distribution analyzer block is determined by a genre or expected content type of the signal being processed.

The user may according to this embodiment adjust the length of the distribution analyzer's window, in order for it to fit the genre, type or source of the input signal. Alternatively, meta-data containing such genre information may be employed.

An advantageous embodiment of the present invention is obtained when the length of the finite-length sliding window of said distribution analyzer block is determined corresponding to the duration of a particular program being processed.

When the duration of the particular programme to be processed is known before the processing of the programme begins, the length of the distribution analyzer's window may be set to contain the entire programme. In this case, none of the time-varying levels of the programme are discarded from the distribution, while the programme is being processed, leading to a more accurate estimate of the level distribution of the programme.

An advantageous embodiment of the present invention is obtained when said transfer function generator block is arranged to maintain an estimate of the distribution of time-varying level of the output audio signal, based on past said time-varying transfer functions combined with past said time-varying level distributions; and wherein the transfer function generator block is further arranged to determine a time-varying transfer function on the basis of said estimate of the distribution of time-varying level of the output audio signal.

When the duration of the programme is known in advance, the Loudness Processor may be able to take into account "sub-optimal" processing at the beginning of the programme, when it is processing the end of the programme. Thus the resulting integrated loudness level, for the entire programme, may be very close to the predetermined target loudness level—even though the dynamic properties of the programme were not stationary during the programme.

For example, suppose the first part of a programme is relatively soft, whereas the last part of the programme is relatively loud. In this case, the Loudness Processor might apply a higher time-varying gain to the first part than it would have done, if it had 'known' what was coming later. However, this past/initial processing may be corrected automatically, by making the last (loud) part correspondingly softer, such that the integrated loudness level will match its target nonetheless.

Such feedback adaptation may change the transfer function by a few dB or less, barely noticeable to the viewer/listener, but it may nevertheless be desirable in order for the broadcaster to meet the required Target loudness level, for instance, of a live programme.

An advantageous embodiment of the present invention is obtained when said transfer function generator block is arranged to determine said time-varying transfer function such that the resulting time-varying gain, for an input audio signal with constant time-varying level, corresponds to the difference between said target loudness level and an estimated integrated loudness level of the input audio signal.

According to this embodiment, if the input signal consists of, for example, a pure tone, i.e. having constant time-varying loudness level, and that level differed from the predetermined target loudness level, then the processor would apply a time-varying gain which is constant, and which would in effect make the level of the tone, after processing, match the target level.

An advantageous embodiment of the present invention is obtained when said transfer function generator block is arranged to determine a loudness level estimated on the basis of said time-varying level distribution by performing an RMS calculation.

The RMS calculation may correspond to an Leq-type measure of integrated loudness level. This method is commonly used as a simple measure of the overall loudness of a broadcast programme.

An advantageous embodiment of the present invention is obtained when said transfer function generator block is arranged to determine a loudness level estimated on the basis of said time-varying level distribution by performing an RMS calculation in which levels below a threshold level are excluded.

According to this embodiment, the threshold may for example be absolute level, or a level relative to the overall RMS level.

An advantageous embodiment of the present invention is obtained when said transfer function generator block is arranged to determine a loudness level estimated on the basis of said time-varying level distribution by performing an averaging calculation in which higher levels receive a higher weight than lower levels, according to a weighting function.

An advantageous embodiment of the present invention is obtained when said transfer function generator block is arranged to determine a loudness level estimated on the basis of said time-varying level distribution by performing an RMS calculation in which the levels below a threshold are excluded, as specified in the calculation of integrated, gated loudness level of ITU-R BS-1770-2 and EBU R-128.

By this embodiment, soft or hard gating of silent/near-silent levels is facilitated.

An advantageous embodiment of the present invention is obtained when said transfer function generator block is arranged to determine a degree of compression of said time-varying transfer function on the basis of a difference between said target loudness range and a distance between two percentiles estimated on the basis of said time-varying level distribution.

An advantageous embodiment of the present invention is obtained when said transfer function generator block is arranged to determine a degree of compression of said time-varying transfer function is based on the difference between said target loudness range and a distance between two percentiles estimated on the basis of said time-varying level distribution, as specified in the calculation of the LRA measure of EBU Tech. Doc. 3342 and EBU R-128.

It is noted that the transfer function generator may basically use any method and take any form serving the purpose of the present invention. The choice of the appropriate transfer function generator for the particular application may depend on the genre of the input signal, the type of processing desired, and trade-offs determined by subjective judgment of the producer etc.

An advantageous embodiment of the present invention is obtained when said transfer function generator block is arranged to determine said time-varying transfer function based on one or more heuristic rules.

By enabling for example approximate or experience-based ways and rules for determining a transfer function or a part thereof, some specific properties and problems may be addressed, which would be difficult or impossible to analyze exact. An examples of such a heuristic rule could be: If the left tail of the distribution function contains a 'bump' then that might correspond to the noise floor of the input signal, and the upper side of the 'bump' would then be the level below which the transfer function should apply dynamic expansion (i.e. noise reduction). Other heuristics might involve, for instance "action sounds" or speech.

An advantageous embodiment of the present invention is obtained when the loudness signal processor comprises a preprocessor arranged to preprocess said input audio signal prior to said level detector block.

An advantageous embodiment of the present invention is obtained when said preprocessor comprises frequency weighting, preferably a filter applied to the input audio signal.

A frequency weighting may preferably be based on the frequency-dependent loudness sensitivity of the auditory system (i.e. equal loudness contours).

An advantageous embodiment of the present invention is obtained when said pre-processor comprises an A-, C-, or K-weighting filter.

Preferably, a K-weighting filter is applied when the input is an audio signal measured 'electrically' (rather than acoustically), such as a broadcast programme.

An advantageous embodiment of the present invention is obtained when said pre-processor comprises channel weighting, preferably by being arranged to combine a multi-channel input audio signal into a single-channel preprocessed signal.

Where the audio input signal consists of multiple audio channels, those channels are in an embodiment of the invention combined to form a single preprocessed signal feeding the level detector and thus leading to a single time-varying loudness level, rather than one time-varying loudness level per input channel.

An advantageous embodiment of the present invention is obtained when said channel weighting comprises a per-sample power domain sum of channels of said input audio signal.

For example, the channel weighting may be implemented by a power sum of the 'left' and 'right' channels, in case of a stereo input signal.

An advantageous embodiment of the present invention is obtained when said channel weighting comprises a gain matrix containing a gain coefficient for each individual channel of the input audio signal.

The preprocessor may in an embodiment of the invention apply channel weighting such that the channels of a multi-channel input signal (e.g. a 5.1 surround signal) would be weighted by individual gain factors.

An advantageous embodiment of the present invention is obtained when the loudness signal processor comprises a smoothing filter arranged to smooth said time-varying gain such that abrupt changes of said gain would not cause distortion of the output audio signal.

In an embodiment of the invention, a smoothing filter is applied, such as a 1st order low-pass filter, to the time-varying attenuation gain. Thereby abrupt changes of the gain value that may occur would be prevented from causing distortion of the output signal. Note that the immediately perceptible properties of the dynamic processor, such as being, for example, aggressive or soft may be primarily related to the properties of the smoothing filter, whereas the adaptive properties of the Distribution Analyzer (e.g. its window length) are controlled independently hereof. This way, the advantageous embodiment can be 'tuned' to different (subjective) requirements for its sound and adaptiveness.

The invention further relates to a loudness signal processor for processing an input audio signal in order to control a resulting integrated loudness level and a resulting loudness range of an output audio signal by a predetermined target loudness level and by a predetermined target loudness range, the loudness signal processor comprising an input arranged to receive an input audio signal; a level detector block arranged to determine a time-varying level of said input audio signal; a distribution analyzer block arranged to provide a level distribution of said time-varying level under consideration of weight factors or inclusion rules determined by metadata; a transfer function generator block arranged to determine a transfer function on the basis of said level distribution, and said predetermined target loudness level and said predetermined target loudness range; a gain control block arranged to calculate a time-varying gain on the basis of said time-varying level of the input audio signal and said transfer function; a multiplier block arranged to apply said time-varying gain to said input audio signal, resulting in said output audio signal.

In other words, the metadata provides a class or type of the input signal, where the class might be supplied together with the input signal, from a separate source, or may be generated by, for instance, a signal classifier. The metadata may correspond to the content, but also, for instance, the format of the input audio signal.

For a certain class of the input signal, the distribution analyzer block might let the corresponding period(s) of the time-varying level have greater influence on its distribution estimate. Moreover, if the weight was sufficiently low, the distribution analyzer block might exclude a period of the time-varying level from its estimate.

An advantageous embodiment of the present invention is obtained when said distribution analyzer block maintains two or more instances, and said metadata determines the inclusion of the corresponding time-varying level by one distribution analyzer instance, and exclusion from the others.

An advantageous embodiment of the present invention is obtained when said metadata comprises indication of whether the input audio signal has been loudness normalized or loudness processed, according to certain specifications, or not.

An advantageous embodiment of the present invention is obtained when said metadata comprises indication of whether the input audio signal contains predominantly speech or not.

An advantageous embodiment of the present invention is obtained when said metadata correspond to whether the input audio signal contains predominantly music which has been dynamically processed, or not.

The present invention further relates to a loudness signal processor for processing an input audio signal in order to control a resulting integrated loudness level and a resulting loudness range of an output audio signal by a predetermined target loudness level and by a predetermined target loudness range, the loudness signal processor comprising an input arranged to receive an input audio signal; a level detector block arranged to determine a time-varying level of said input audio signal; a distribution analyzer block comprising a priming with a predetermined level distribution and being arranged to provide a level distribution; a transfer function generator block arranged to determine a transfer function on the basis of said level distribution, and said predetermined target loudness level and said predetermined target loudness range; a gain control block arranged to calculate a time-varying gain on the basis of said time-varying level of the input audio signal and said transfer function; a multiplier block arranged to apply said time-varying gain to said input audio signal, resulting in said output audio signal.

Thereby is provided a loudness processor that may process loudness level and loudness range for an audio signal in accordance with a predetermined distribution, e.g. from a pre-analysis of the audio signal, one or more expectedly similar audio signals, a programme type or audio genre information or other meta data, etc.

An advantageous embodiment of the present invention is obtained when said distribution analyzer block comprises a priming with a predetermined level distribution which has been generated in advance based on a collection of programs belonging to the same audio signal type that have first been loudness normalized individually, then their time-varying levels measured forming individual level distributions, and then all these distributions combined into the predetermined distribution to be used for priming.

An advantageous embodiment of the present invention is obtained when the distribution analyzer block is arranged to estimate a time-varying level distribution of said time-varying level, and is further arranged to provide said level distribution based on said predetermined level distribution, said time-varying level distribution, or a combination thereof.

By combining the time-varying, i.e. typically live or short-lived, level distribution analysis with a predetermined level distribution, several options and applications are enabled. In a preferred embodiment, the combination is used to be able to make a reasonable processing already from the beginning where the time-varying level distribution may be unreliable until a sufficient amount of samples have been analyzed.

In a preferred embodiment, a combination of the predetermined distribution and the time-varying distribution are used such that the emphasis is put on the predetermined distribution when analyzed data are few or statistically unreliable, but the emphasis 'morphs' towards the time-varying level distribution when it becomes significant or stable; or when there is indication that the predetermined distribution does not fit the actual audio signal.

In an embodiment, the combination of predetermined level distribution and time-varying level distribution is used such that certain parameters, e.g. regarding loudness range, are based on one distribution, and other parameters, e.g. regarding loudness level, on another. In a preferred embodiment, the transfer function may be established by considering loudness range in the light of the predetermined level distribution, and loudness level in the light of the time-varying level distribution.

Any of the other priming features or embodiments with priming described above also relates to and may be combined with the priming-related embodiments described here.

The mixing of predetermined level distribution and time-varying level distribution may be carried out in the distribution analyzer block, in which case it blends the two distributions into one level distribution according to the above or other schemes, and passes it to the transfer function generator block. Alternatively, the level distribution received by the transfer function generator block may comprise a set of both or more level distributions to let the transfer function generator block decide on the mixing and morphing between the relevant distributions.

The present invention further relates to a loudness signal processor for processing an input audio signal in order to control a resulting integrated loudness level and a resulting loudness range of an output audio signal by a predetermined target loudness level and by a predetermined target loudness range, the loudness signal processor comprising an input arranged to receive an input audio signal; an output level detector block arranged to determine a time-varying level of said output audio signal; a distribution analyzer block arranged to estimate a time-varying level distribution of said time-varying level; a transfer function generator block arranged to determine a time-varying transfer function on the basis of said time-varying level distribution, and said predetermined target loudness level and said predetermined target loudness range; a gain control block arranged to calculate a time-varying gain on the basis of a time-varying level of the input audio signal and said time-varying transfer function; a multiplier block arranged to apply said time-varying gain to said input audio signal, resulting in said output audio signal.

Thereby the level distribution is determined on the basis of the actual output signal. In some embodiments, for example having a smoothing filter with significant impact, the feedback from the output instead of estimations (of the output) based on the input may enable improved control of the resulting loudness properties of the output signal.

The present invention further relates to a loudness control method for controlling an integrated loudness level and a loudness range of an audio signal on the basis of a predetermined target loudness level and a predetermined target loudness range, the loudness control method comprising: receiving said audio signal as an input audio signal; determining a time-varying level of said input audio signal; estimating a time-varying level distribution of said time-varying level; determining a time-varying transfer function on the basis of said time-varying level distribution, and said predetermined target loudness level and said predetermined target loudness range; calculating a time-varying gain on the basis of said time-varying level of the input audio signal and said time-varying transfer function; and applying said time-varying gain to said input audio signal to establish an output audio signal.

Thereby is provided an advantageous method for controlling loudness which allows the user to setup target parameters for the output signal, without necessarily having prior knowledge of the characteristics of the material to be processed. This is very advantageous over prior art where the user have to setup the processing by specifying processing parameters such as e.g. a transfer function, compression amount and threshold, etc., which requires good knowledge or prior analysis of the relevant programme material to actually end up satisfying target characteristics for the output signal, e.g. specified by a relevant standard or regulation. With the disclosed method the requirements of a standard or regulation can simply be used directly as target parameters for the loudness control methods and loudness processors disclosed.

The disclosed method is further advantageous over prior art loudness processing because it adapts to the audio signal provided to it. Besides thereby achieving the above benefit of not requiring processing parameters, this also means, that material that has already been compressed in a previous process, will not be further compressed by the present method unless it doesn't satisfy the target parameters of level and range. In an embodiment of the invention, heavily compressed input audio signals may even be expanded or gained up, to better fit the target parameters.

An advantageous embodiment of the present invention is obtained when said estimating the time-varying level distribution is based on a part of said input audio signal by considering values of said time-varying level corresponding to different times with two or more different weights.

When estimating the time-varying level distribution, according to a preferred embodiment, only levels of a part of the input audio signal are considered. The considered part may be the entire elapsed part of the input audio signal, or a fixed or variable time window thereof. In an embodiment, the levels determined at different times are, however, considered with different weights, for example to control how significant an extreme level determined at a certain time will be considered at different certain later times, e.g. soon after and long after. In an embodiment where all levels determined within a window of a certain time span are desired to be considered with equal weight, e.g. running histogram-like distribution estimation, this effectively means that a weight of zero is applied to levels outside that window, thus making the number of used weights two. In an embodiment where all or most levels determined during elapsed time of the input audio signal are desired to be considered, however the older, the less significant, e.g. a recursive—type of distribution estimation, this means that a multitude of different weights (implicitly) are applied.

In other words, in a preferred embodiment, past determined levels will be considered with a decreased significance at some time, the options comprising at one extreme the simple two steps of either full consideration or zero consideration, or different varieties of degrading consideration with the age of the past level down to and including or not including zero consideration.

An advantageous embodiment of the present invention is obtained when said estimating the time-varying level distribution is performed by means of a finite-length sliding window.

An advantageous embodiment of the present invention is obtained when said estimating the time-varying level distribution is performed by means of a set of IIR filters.

The present invention further relates to a loudness control method for controlling an integrated loudness level and a loudness range of an audio signal on the basis of a predetermined target loudness level and a predetermined target loudness range, the loudness control method comprising performing the following steps for each of a plurality of partial audio signals all being parts of said audio signal to establish a plurality of partial output audio signal together forming an output audio signal; the steps comprising: determining a level of said partial audio signal; estimating a level distribution on the basis of said level and levels of one or more previous partial audio signals; determining a transfer function on the basis of said level distribution, and said predetermined target loudness level and said predetermined target loudness range; calculating a gain on the basis of said level of said partial audio signal and said transfer function; and applying said gain to said partial audio signal to establish a partial output audio signal.

By partial audio signal is referred to a part of an audio signal. For digital audio signals, the partial audio signal would typically consist of a number of consecutive audio samples, in one or more channels. In an embodiment providing side chain processing at the full audio signal sample rate, the partial audio signal may e.g. consist of a single sample of the audio signal, whereas typical processors performing the side chain processing at a fraction of the audio sample rate, one instant in the side chain would typically relate to several audio samples.

By this method is provided an advantageous method for controlling loudness which allows the user to setup target parameters for the output signal, without necessarily having prior knowledge of the characteristics of the material to be processed. This is very advantageous over prior art where the user have to setup the processing by specifying processing parameters such as e.g. a transfer function, compression amount and threshold, etc., which requires good knowledge or prior analysis of the relevant programme material to actually end up satisfying target characteristics for the output signal, e.g. specified by a relevant standard or regulation. With the disclosed method the requirements of a standard or regulation can simply be used directly as target parameters for the loudness control methods and loudness processors disclosed.

The disclosed method is further advantageous over prior art loudness processing because it adapts to the audio signal provided to it. Besides thereby achieving the above benefit of not requiring processing parameters, this also means, that material that has already been compressed in a previous process, will not be further compressed by the present method unless it doesn't satisfy the target parameters of level and range. In an embodiment of the invention, heavily compressed input audio signals may even be expanded or gained up, to better fit the target parameters.

DRAWINGS

Figure 5:
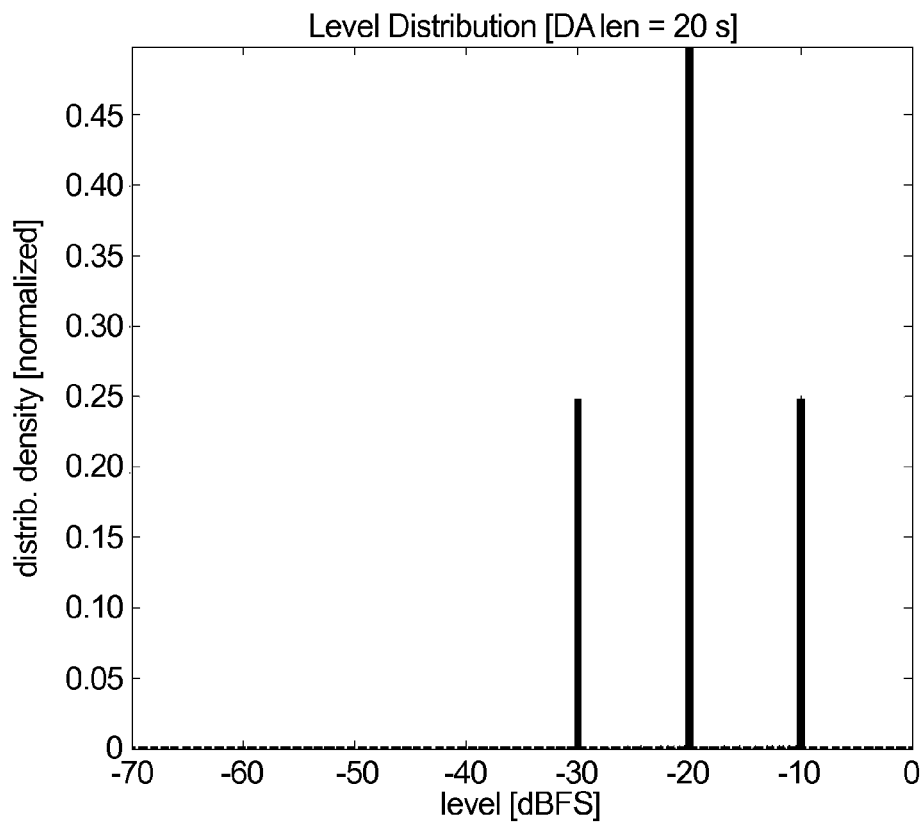

The present invention will in the following be described with reference to the drawings, illustrating:

FIG. 1: Block diagram of a prior art signal processor performing dynamic range compression or expansion, FIG. 2: Block diagram of an embodiment of the present invention, FIG. 3: Block diagram of a preferred embodiment of the invention, comprising optional Delay block, optional Preprocessor block and optional Smoothing filter block, FIG. 4: Time-domain plot of a test signal (RMS level) used for simulating the invention, FIG. 5: Histogram plot of the test signal (i.e. level distribution), FIGS. 6-20: Plots illustrating the results of simulating a processing of the test signal by different embodiments of the present invention.

DETAILED DESCRIPTION

The present invention constitutes a loudness level and loudness range processor. It comprises an audio signal processor which can control the loudness level as well as the loudness range of the audio signal, by means of applying a time-varying gain controlled on the basis of a continuous analysis of the signal. Various embodiments of the present invention including alternatives and optional features will be described in the following. Further suitable combinations of the disclosed embodiments, alternatives and features than exemplified in the following are within the scope of the present invention.

Description of the Blocks

Figure 2:
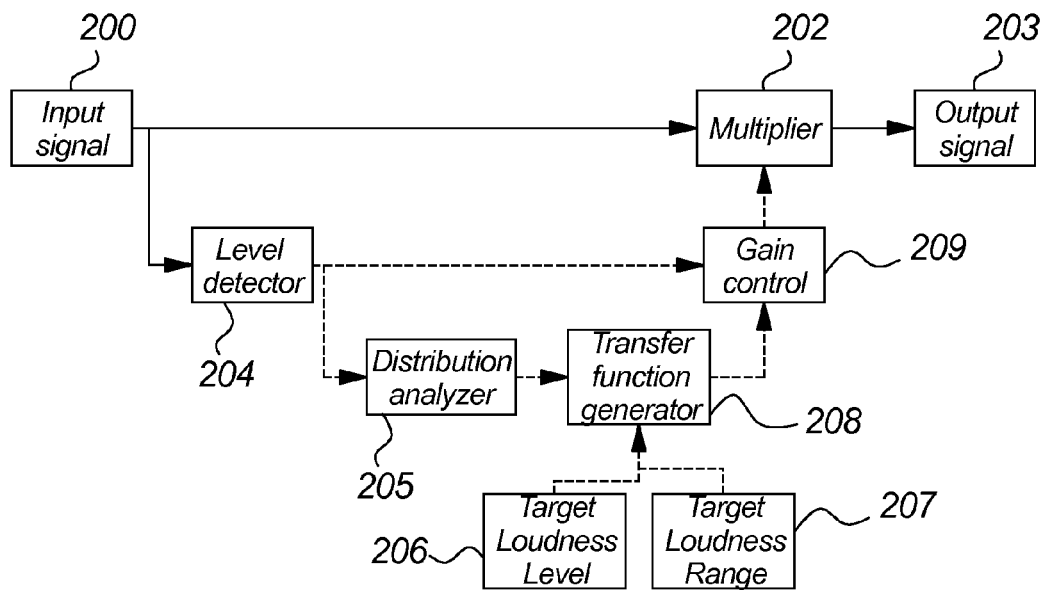

FIG. 2 shows an embodiment of the present invention. The solid line connections indicate audio signals, whereas dashed line connections indicates control signals, which may optionally be down-sampled compared to the audio signal rate, or parameters. A block (200) represents an audio input signal, to which a variable gain is applied by a Multiplier block (202), to produce an audio output signal (203).

A side chain comprises a Level detector block (204), which determines a time-varying level of the input signal. A Distribution Analyzer block (205) estimates the level distribution over time based on the output from the level detector (204). As the distribution is continually updated, taking into account "new" levels, the output of 205 is a time-varying level distribution.

A Transfer Function Generator block (208) then generates a transfer function to be used by the Gain Control block (209). The transfer function is designed such that the dynamics processing of the input signal, based on the transfer function, will fulfill two "target" parameters—the Target loudness level and the Target loudness range. In other words, the target parameters specify properties of the desired result, and block 208 then calculates how best to obtain that result, based on what it 'knows' about the input signal.

The two 'target' parameters are understood as goals or objectives of the loudness processing. It may be, due to the invention being a real-time processor, that the properties of the output signal would deviate somewhat from these targets. This might also depend on the particular input signal, and on how well it fits the model of the input estimated by the Distribution Analyzer. Even with some deviation from the target parameters, the processing might still be desirable in a given application. For instance, in a live broadcasting application, some deviation from the specified target parameters would be expected (see e.g. EBU (2010)).

An Embodiment Described in Detail

A detailed description follows of an embodiment of the present invention. Several variants of the central elements are described. In order to provide sufficient detail in an unambiguous manner, MATLAB® by MathWorks® code is provided to demonstrate one implementation. This MATLAB code only relies on functions available in a standard MATLAB installation, and full documentation for all functions and operators used in the following code snippets are thereby easily found, e.g. at the MathWorks website, http://www.mathworks.com/help, the relevant parts of the MATLAB documentation hereby incorporated by reference. However, trivial details—such as variable initialization and sample loops—have been omitted here for clarity. Note, that in MATLAB-code the percent-sign, %, marks the beginning of a text comment, which is in the following used to provide a few explanations about the code.

Prerequisites

In the following is assumed that the Input signal (200) is stored as digital samples in vector IS. The sample-rate is stored in fs, fs=48000 Hz will be used in the examples, but any sample rate is within the scope of the invention. The variable i is the sample counter, the index of the current input and output sample. Note that even though all the input samples are stored in IS in this demonstration, the code never uses any value of IS greater than i (i.e. the system is causal)—that is, the examples all simulate a real-time processing.

Level Detector (204)

This example embodiment of the invention shows an implementation of an RMS type of level detector, where LD(i) is the output of the level detector for the current sample, and detector_samps denotes the length of the detector's sliding window, in samples. Here, a 50 ms window (detector_samps=2400) is used. This may be considered a simple estimate of time-varying loudness level.

The same principle could be implemented as an averaging FIR filter, having the squared samples as input.
LD(i)=sqrt(mean(IS(i-detector_samps:i).^2)); % RootMean-Square value
LD(i)=20*log 10(LD(i)); % Convert to dB Alternatively, an IIR type level detector could be employed, as is common in prior art dynamic compressors (see e.g. Zölzer).

Distribution Analyzer (205)

According to this example embodiment of the invention, the Distribution Analyzer is implemented as a sliding window, of DA_secs seconds length. The length of the sliding window of the distribution analyzer should preferably be long enough to cover different "kinds" of loudness dynamics used in the program, e.g. conversation, moody passages, intense passages, etc., to be able to estimate a stable level distribution. However, the window should preferably not be so long that it covers (a large part of) a different program type or otherwise passages whose influence on the integrated loudness level is undesired. Thus, the optimal value for DA_secs would depend on the content type and genre being processed, but an example of a value for the DA_secs may be in the range 10-60 minutes. Program types where faster adaption is desired may have shorter values, whereas program types that need a really robust loudness processing e.g. because of a large loudness range but with long time between loudness level changes may require a distribution analysis based on hours of past material.

In this example, the DA estimates 2 percentiles of the statistical distribution corresponding to the samples in its analysis window; 10% and 90% are used as an example. The percentiles will provide the basis for estimating the loudness 'range' of the input signal.
DA_samps=DA_secs*fs;
% Update DA sliding window with new sample
DA_window=[LD(i) DA_window]; DA_window(DA_samps:end)=[ ];
% Compute distribution parameters
percentiles=[10 90];
DA_sort=sort(DA_window);
DA_percen=DA_sort(round((length(DA_sort)-1)*percentiles./100+1));

Optionally, the LD signal may be down-sampled prior to the DA, as an optimization.

Alternatively, block 205 could model the distribution itself, for instance by maintaining a histogram representation, or by continually estimating the parameters of a suitable parametric distribution.

Note that in some embodiments of the invention (involving 'presets'), the DA is 'primed' with a distribution, pre-computed and stored. In this example, this corresponds to simply initializing DA-window with the 'preset' vector of length DA_samps.

The output of the Distribution Analyzer block (205) may comprise several of the determined values, e.g. DA_percen for range processing (compression/expansion) and DA_window as basis for level processing (overall gain).

Transfer Loudness Level and Range (206, 207)

The two target parameters are in this embodiment of the present invention given in the 2 variables below. Note that different target values will be used in the simulations shown in the plots later in this document. Also note, that any target values are within the scope of the invention, as they are preferably user-specified, typically in accordance with broadcasting standards or program standards.
TargetLoudnessLevel=−20; % dBFS
TargetLoudnessRange=15; % dB Here is used a target loudness level specified according to a simple RMS-based calculation of the integrated loudness level (i.e. an Leq loudness level). Other measures could alternatively be used within the scope of the present invention, such as the gated, integrated loudness level (ITU, 2011), or the LLML (Vickers, 2001).

In these examples, a target loudness range is used, defined as the difference, in dB, between a high and a low percentile of the level distribution. Other measures could alternatively be used within the scope of the present invention, such as variants of the LRA descriptor (Skovenborg, 2012), or the Dynamic Spread (Vickers, 2001).

The implementation of blocks 205 and 208 (and possibly 204 and 301) would in any case have to correspond to the loudness level and loudness range measures which the target parameters refer to.

Transfer Function Generator (208)

Within the scope of the present invention, four different implementations of block 208 are shown in the following, with different properties and features. In the following code examples, TF denotes the transfer function, and variables with TF_ prefix are variables related to the generation of the transfer function TF.

The vector LX contains a set of levels, in increasing order, which are essentially the X-axis of the transfer function (in the representation used here), i.e. LX determines the span and resolution of the transfer function. For example, LX= [−80:0.2:0]; (in MATLAB notation).

---
TF method 1
---
```
TF_Range = diff(DA_percen);
TF_Comp = TF_Range − TargetLoudnessRange; % how
    much compression needed (dB)
% Generate compression transfer function
for k = 1: length(LX)
    if LX(k) <= DA_percen(1) % below lower percentile
        TF(k) = LX(k);
    else
        If TF_Comp > 0
            r = TF_Range/(TF_Range − TF_Comp);
        else
            r = 1; % don't apply dynamic expansion
        end
        TF(k) = (LX(k) − DA percen(1))/r + DA_percen(1);
    end
end
% Calculate post-comp integrated level (RMS method)
DA_window_comp = interp1(LX, TF, DA_window, 'nearest');
TF_IntegratedPostComp = 10*log10(mean(10.^
    (DA_window_comp./10)) );
TF_Gain = TargetLoudnessLevel − TF_IntegratedPostComp;
% Generate the Transfer Function
TF = TF +TF_Gain;
```
---

Method 1 calculates the degree of compression needed to match the target loudness range, but it does not apply dynamic expansion, in case the loudness range of the input signal is smaller than the specified target range. It then 'shifts' the transfer function, corresponding to a static gain, in order for the compressed (output) signal to match the target loudness level. An equivalent method could be implemented based on other representations of the level distribution (by block 205).

---
TF method 2
Similar to TF method 1, except:
---
```
% Generate compression/expansion transfer function
for k = 1:length(LX)
    if LX(k) <= DA_percen(1) % below lower percentile
        r = 1/2; % low-level expansion (noise reduction)
        TF(k) = (LX(k) − DA_percen(1))/r + DA_percen(1);
    else
        if TF_Comp > 0
            r = TF_Range/(TF_Range − TF_Comp);
        else
            r = 1; % don't apply dynamic expansion
        end
        TF(k) − (LX(k) − DA_percen(1))/ r + DA_percen(1);
    end
end
```
---

Method 2 furthermore applies dynamic expansion at low levels, at a ratio 1:2, in order to perform single-ended noise reduction. Note that the threshold for what is regarded as "low levels" is signal-dependent, as it is the lower percentile of the level distribution. Thus, if the input signal was somehow gained up X dB, then the "low levels" threshold by this example would automatically also move up by X dB.

---
TF method 3
---
```
TF_Range = diff(DA_percen);
TF_Comp = TF_Range − TargetLoudnessRange;
% how much compression needed (dB)
TF_Comp = max(TF)_Comp, 0);
% Generate compression transfer function
if TF_Range > 0
    r = TF_Range/(TF_Range − TF_Comp);
else
    r = 1; % initially
end
XY = [min(LX), min(LX)
    DA_percen(1), DA_percen(1);
    DA_percen(2) + 0.01, DA_percen(2) + 0.01 − TF_Comp;
    max(LX), (max)LX) − DA_percen(2))/(r*2) + (DA_percen(2) +
0.01 − TF_Comp); % twice the compression at high levels
    ];
TF = interp1(XY(:, 1), XY(:, 2), LX, 'linear');
% Calculate post-comp integrated level (RMS method)
DA_window_comp = interp1(LX, TF, DA_window, 'nearest'):
TF_IntegratedPostComp =
10*log10(mean(10.^(DA_window_comp./10)) );
TF_Gain = TargetLoudnessLevel − TF_IntegratedPostComp;
% Generate the Transfer Function
TF = TF + TF_Gain;
```
---

This method demonstrates that more 'breakpoints' can be added to the transfer function. In this case, levels above the high percentile—i.e. the 10% loudest levels–are compressed with a ratio which is twice that of the normal levels. This feature may be desirable, as "too high levels" are known to be perceptually annoying. Note that, again the generation of the specific TF is guided by signal properties (via the distribution analysis), without the user having to intervene when the signal-type,—genre, or—level changes.

Here, Matlab's linear-interpolation function is employed to construct the TF, for convenience and brevity.

---
TF method 4
Similar to TF method 3, except:
---
```
XY = [min(LX), min (LX);
    DA_percen(1), DA_percen(1);
    DA_percen(2) + 0.01, DA_percen(2) + 0.01 − TF_Comp;
    max(LX), (max(LX) − DA_percen(2))/(r*2) +
    (DA_percen(2) + 0.01 − TF_Comp);
% twice the compression at high levels
    ];
TF = interp1(XY(:, 1), XY(:, 2), LX, 'cubic');
```
---

This method demonstrates, that the transfer function does not need to consist of line segments. Here, a piecewise cubic fit generates a TF which is smooth, without any 'corners', and hence may sound better in some cases. This can be considered a generalization of the 'soft knee' method known from prior art.

Note that in alternative implementations, the actual TF might not be represented explicitly (as in the examples shown here) but may instead be implemented in a functional form (i.e., as a set of 'rules').

Gain Control Block (209)

Based on the transfer function (TF), block 209 calculates the time-varying gain. In this example embodiment of the present invention, the nearest value in the TF vector is simply used. GC(i) is the calculated gain for the current sample, based on the transfer function TF and the level detector output LD(i).

GC(i)=interpl(LX,TF, LD(i), 'nearest')−LD(i); % time-varying gain (dB)

Alternatively, a lower resolution of LX and TF could be used together with an interpolated lookup.

Multiplier Block (202)

Figure 3:
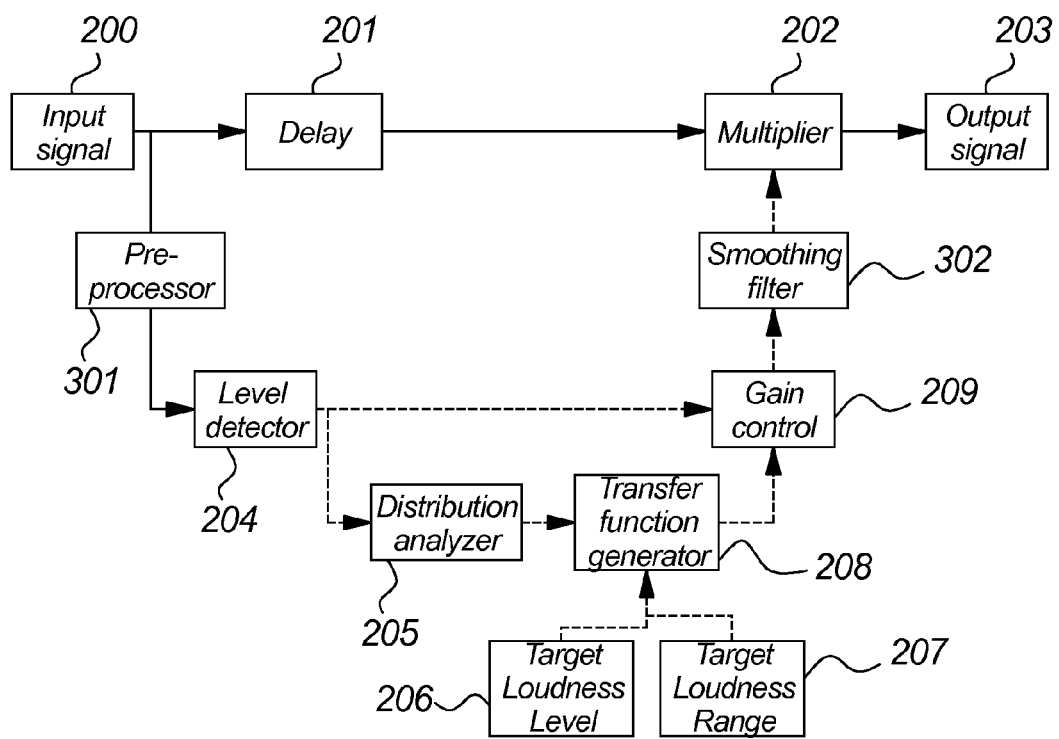

Block 202 applies the time-varying gain to the signal, and thereby produces the next output sample OS(i), and may preferably be embodied as:

g=10^(GC(i)/20); % convert to linear gain
OS(i)=IS(i)*g;

As illustrated in FIG. 3, a smoothing filter 302 could optionally be inserted between block 209 and 202. Optionally, a delay block 201 could be inserted between block 200 and 202, acting as a "look-ahead delay". Both extensions are common in prior art—see Zölzer for details. Optionally, a pre-processor 301 could be inserted before the level detector 204, e.g. for performing frequency weighting or channel weighting.

Description According to the Plots

The following description together with the plots of FIGS. 4-20 demonstrates the example embodiments of the present invention. In all the simulations, the same test signal is used as input.

The input signal used in the demonstration is for the sake of simplicity simply composed of a pure 1 kHz tone, at different levels:

1. 10 s at −20 dBFS
2. 5 s at −30 dBFS
3. 5 s at −10 dBFS

This sequence repeats 3 times, for a total duration of 60 s. See FIG. 4, which is a time-domain plot of the test signal (RMS level). This test signal is quasi-realistic for a real programme in its level distribution, except that using a discrete level distribution—rather than a continuous distribution as a 'real' signal—facilitates demonstrating the dynamic processing taking place. See FIG. 5 which is a histogram plot of the test signal (i.e. level distribution)

Explanation to the Plots:

FIGS. 6-20 show pairs of plots for different simulated processing of the test signal, where each simulation employs a different Transfer Function Generator method, different Target parameters, and/or includes one of the optional features. In all simulations a distribution analyzer (DA) window length of 20 s was used (block 205). The different Transfer Function methods correspond to the examples described in detail above.

For each simulation the corresponding figures show:
- the Transfer Function resulting from block 208 in its state at the end of the input signal,
- the input and output levels, measured over the duration of the test signal. The input level shown corresponds to the output of block 204, and the output level is measured in the same way (though doing so is not part of a preferred embodiment of the invention, but done here for illustration of an effect of the invention).
- the time-varying gain (i.e. output of block 209)
- the integrated loudness level of the whole test signal (i.e. the entire "programme") was measured before and after processing, in order to compare with the Target loudness level.
- the loudness range of the whole test signal (i.e. the entire "programme") was measured before and after processing, in order to compare with the Target loudness range.

Figure 6:
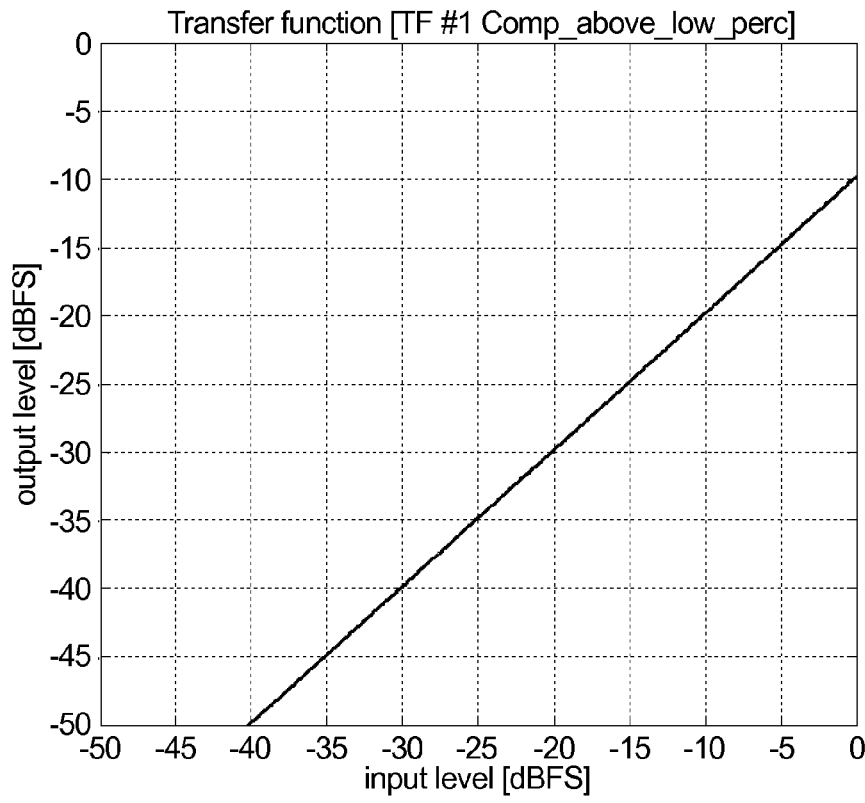
Figure 7:
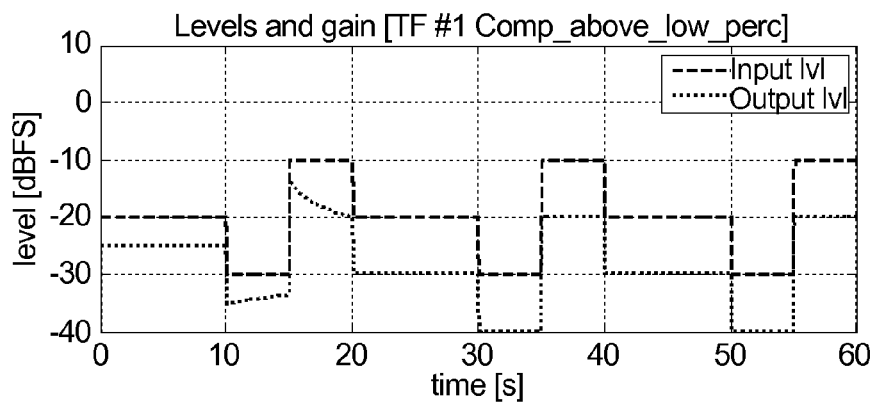
Figure 7:
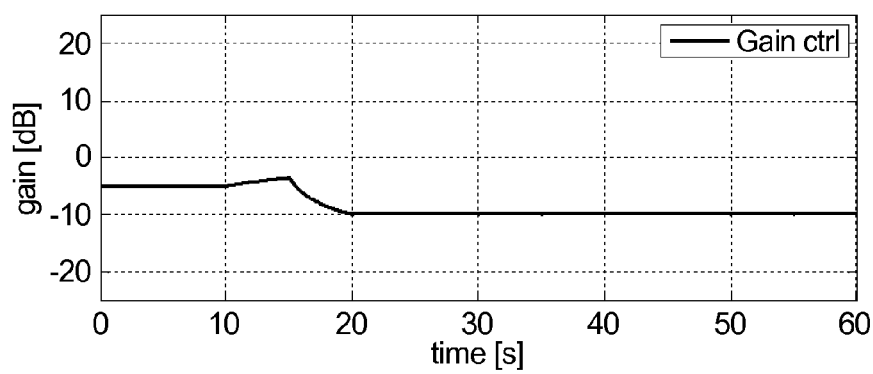

Simulation 1: FIG. 6,7
Transfer Function Generator Method #1
Integrated loudness level: input=−15.2, output=−23.7 (target=−25.0) dBFS
Loudness range: input=20.0, output=20.0 (target=20.0) dB Because the Target loudness range was relatively large (20 dB) no compression was applied by the processor.

Figure 8:
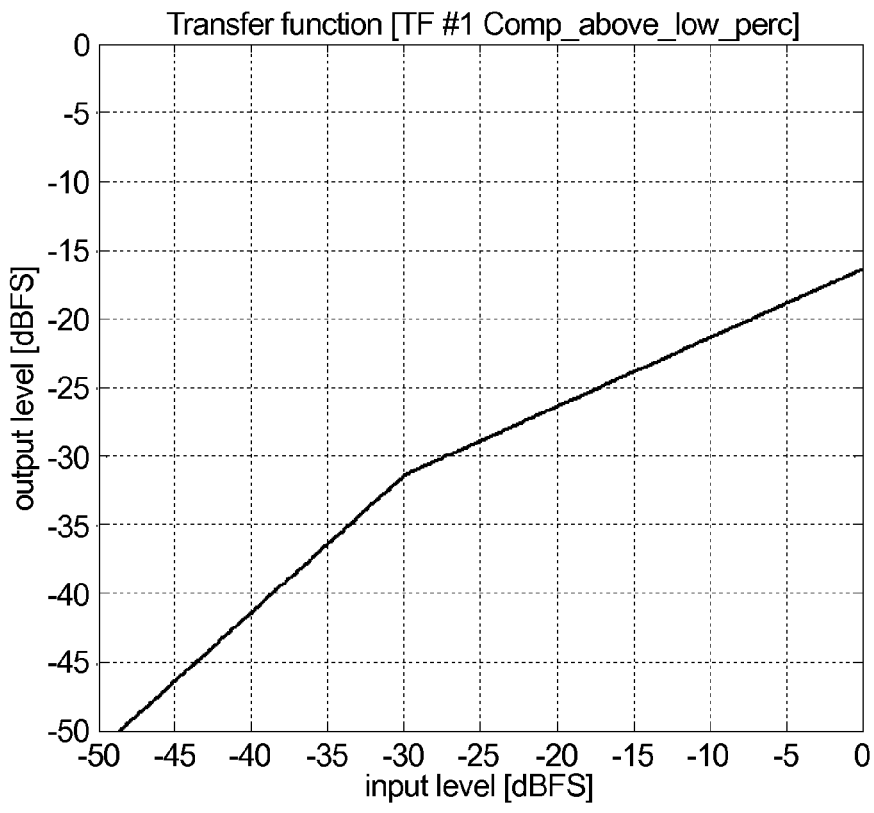
Figure 9:
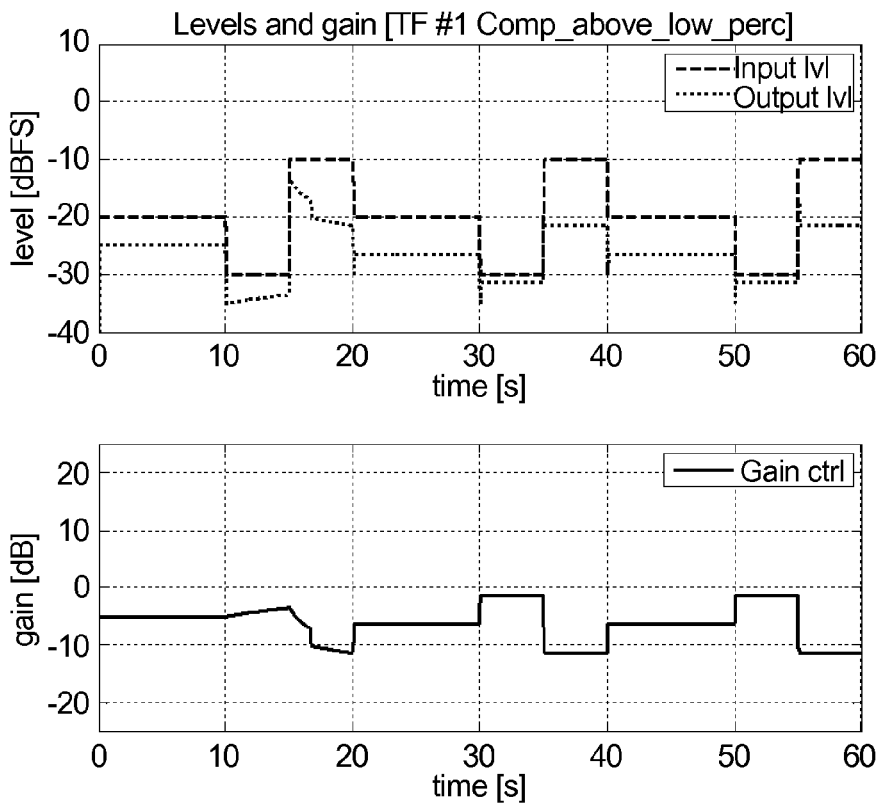

Simulation 2: FIG. 8,9
Transfer Function Generator Method #1
Integrated loudness level: input=−15.2, output=−24.0 (target=−25.0) dBFS
Loudness range: input=20.0, output=10.0 (target=10.0) dB Here the Target loudness range was 10 dB, which was met by the compression applied, while also matching the integrated loudness level of the entire 'programme' within +/−1 dB.

Figure 10:
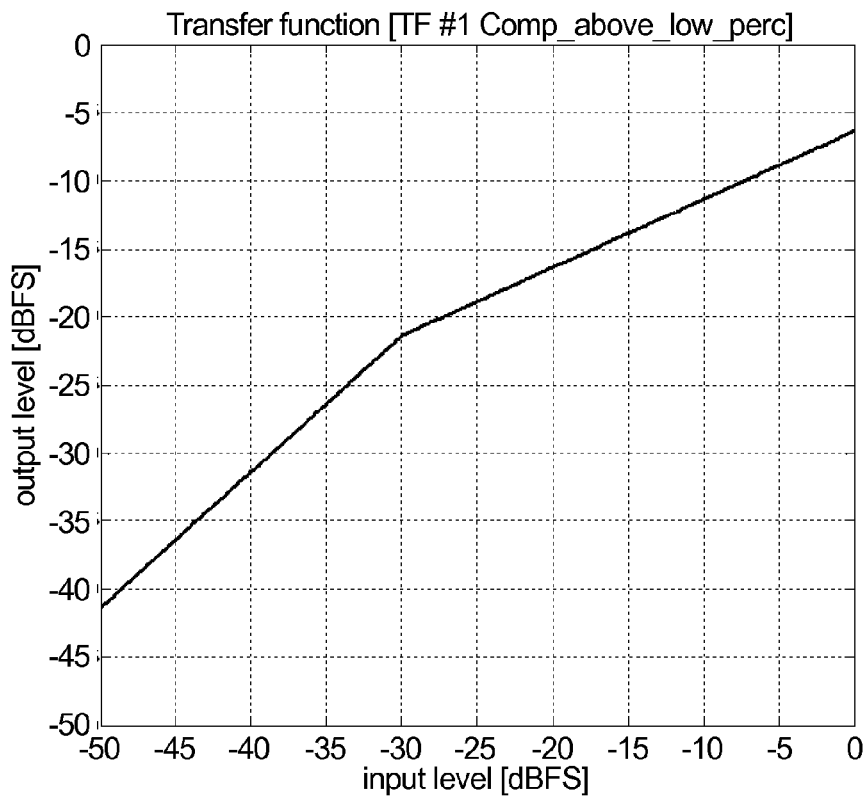
Figure 11:
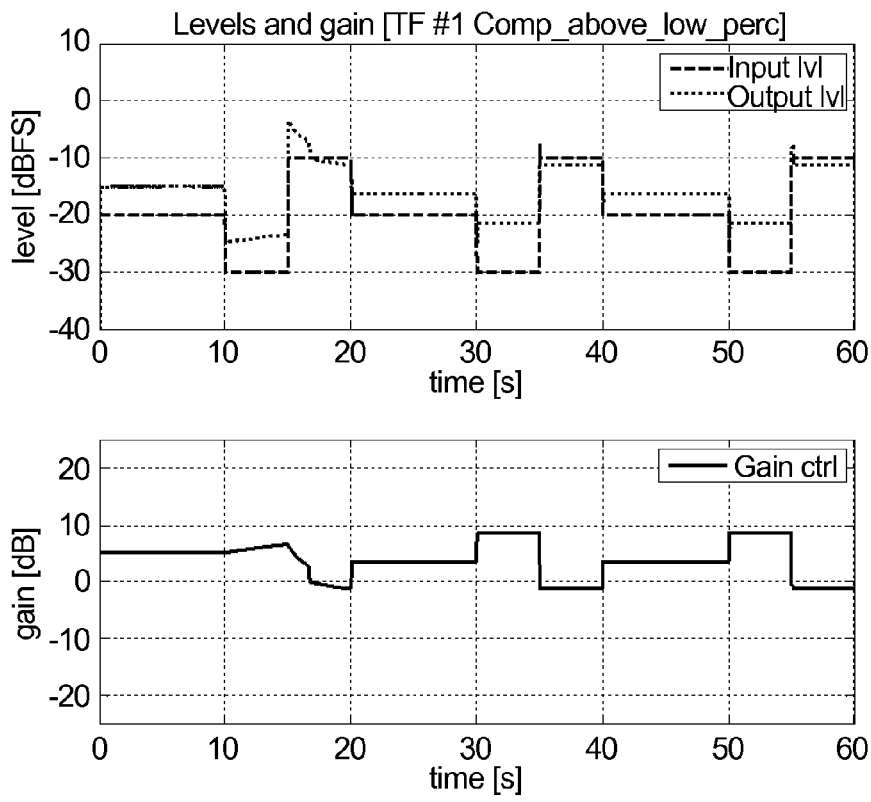

Simulation 3: FIG. 10,11
Transfer Function Generator Method #1
Integrated loudness level: input=−15.2, output=−14.0 (target=−15.0) dBFS
Loudness range: input=20.0, output=10.0 (target=10.0) dB A different target loudness level can also be matched.

Figure 12:
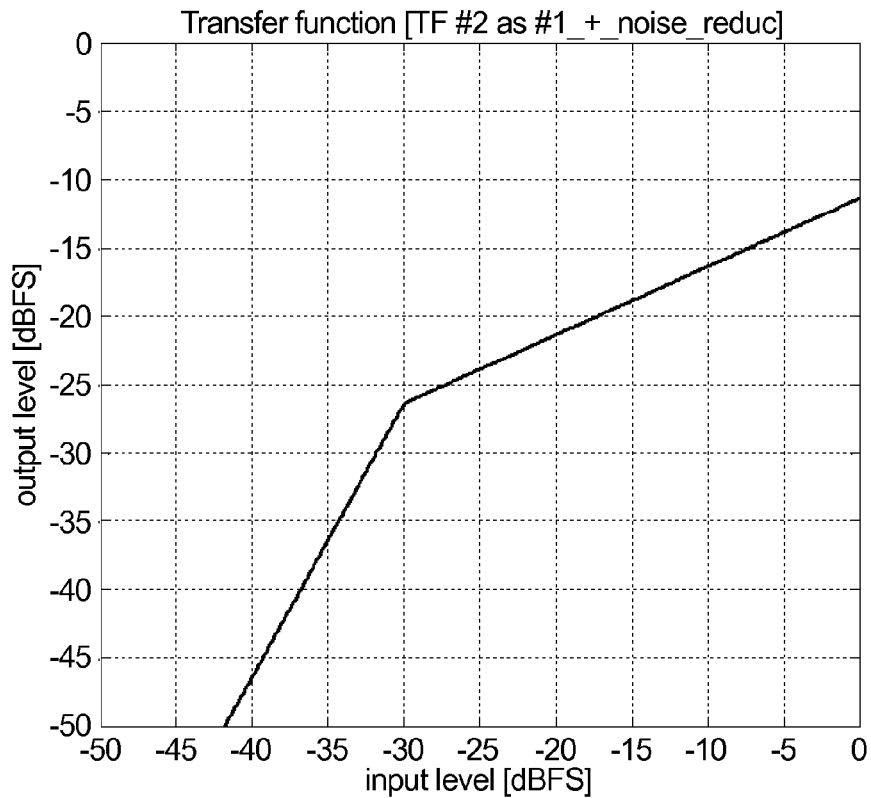
Figure 13:
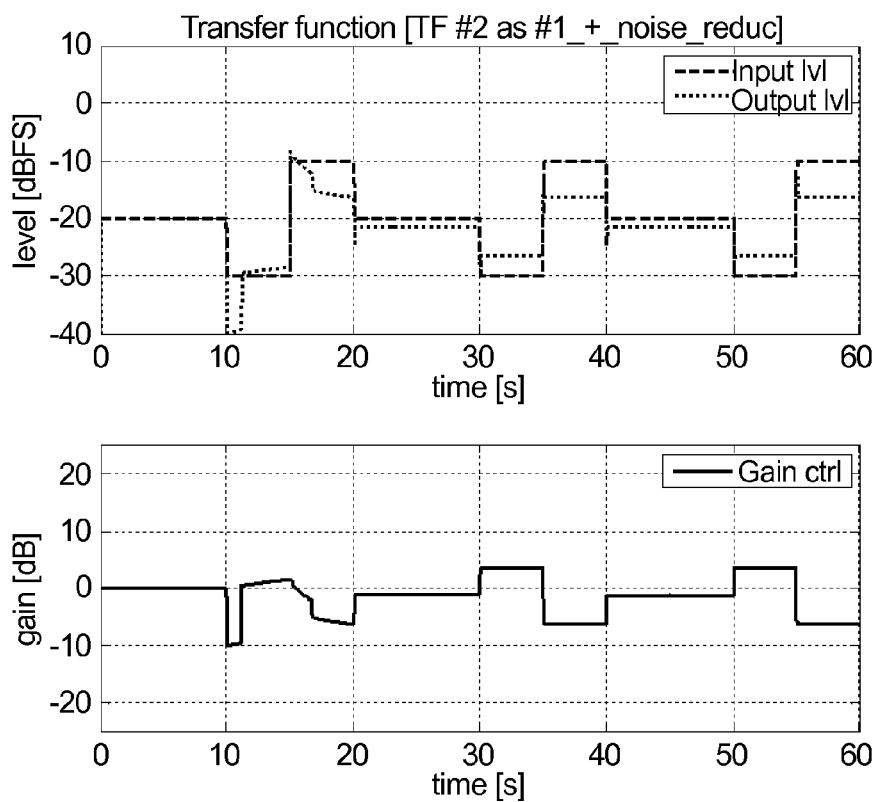

Simulation 4: FIG. 12,13
Transfer Function Generator Method #2
Integrated loudness level: input=−15.2, output=−19.0 (target=−20.0) dBFS
Loudness range: input=20.0, output=10.0 (target=10.0) dB Note the dynamic expansion (i.e. noise reduction) in the transfer function plot, applied below −30 dBFS.

Figure 14:
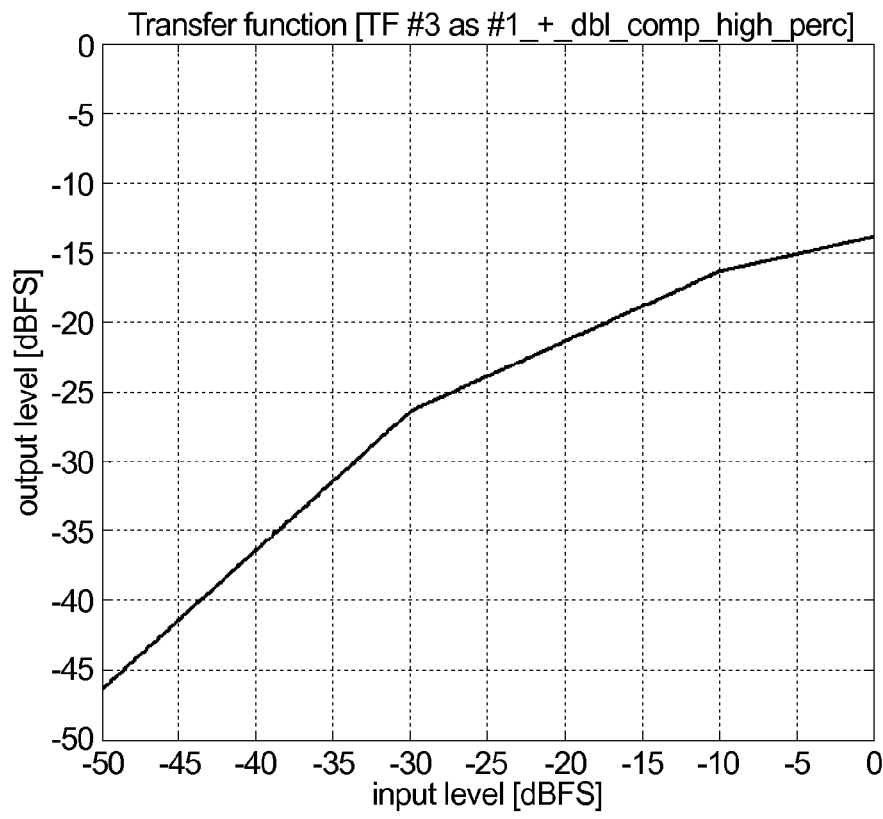
Figure 15:
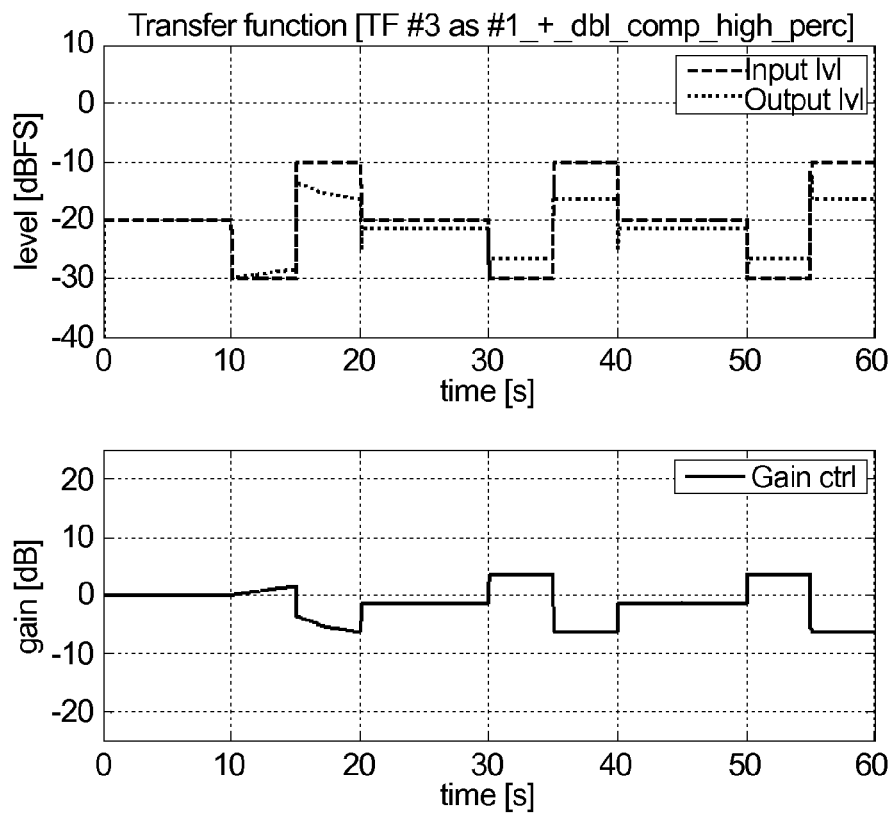

Simulation 5: FIG. 14,15
Transfer Function Generator Method #3
Integrated loudness level: input=−15.2, output=−19.6 (target=−20.0) dBFS
Loudness range: input=20.0, output=10.0 (target=10.0) dB Note the extra break-point in the transfer function plot, leading to a greater compression of levels above −10 dBFS.

Figure 16:
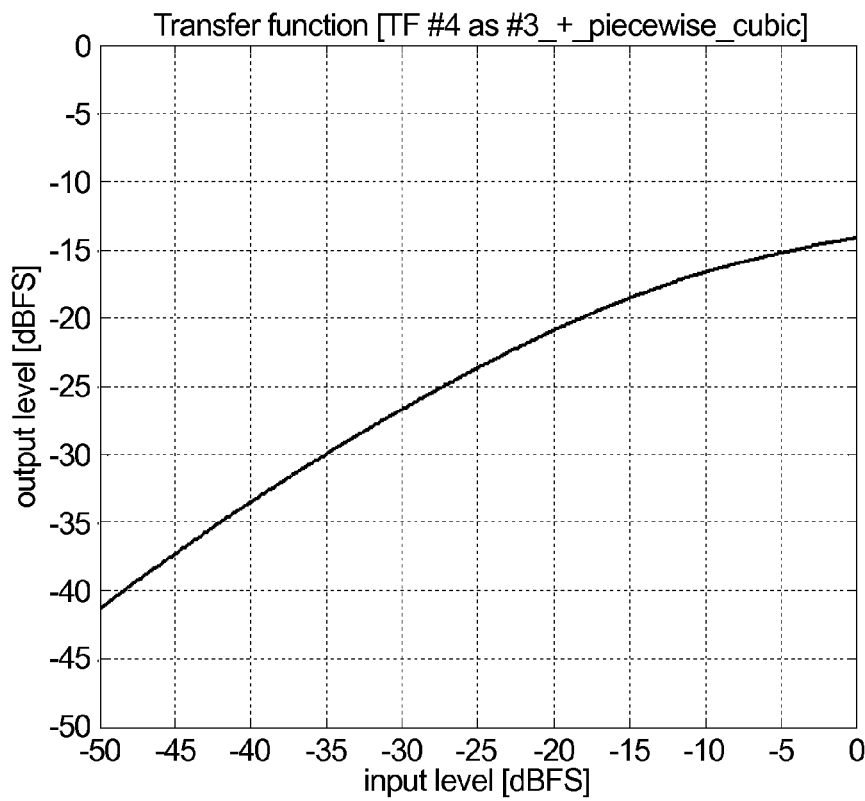

Simulation 6: FIG. 16,17
Transfer Function Generator Method #4
Integrated loudness level: input=−15.2, output=−19.5 (target=−20.0) dBFS
Loudness range: input=20.0, output=10.0 (target=10.0) dB Note the smooth transfer function, which matches the target parameters practically as well as the equivalent line-segment based transfer function (FIG. 14,15).

Figure 18:
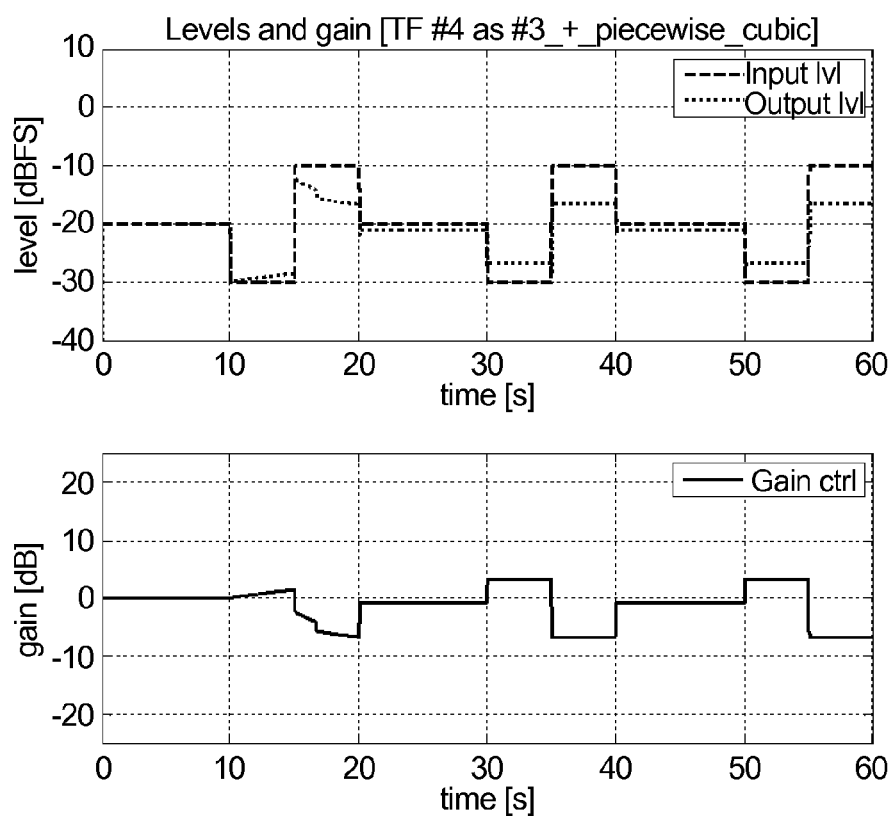

Simulation 7: FIG. 18
Based on the same setup as simulation 6, but this time with a look-ahead delay of 30 ms (block 201 on FIG. 3).

Figure 17:
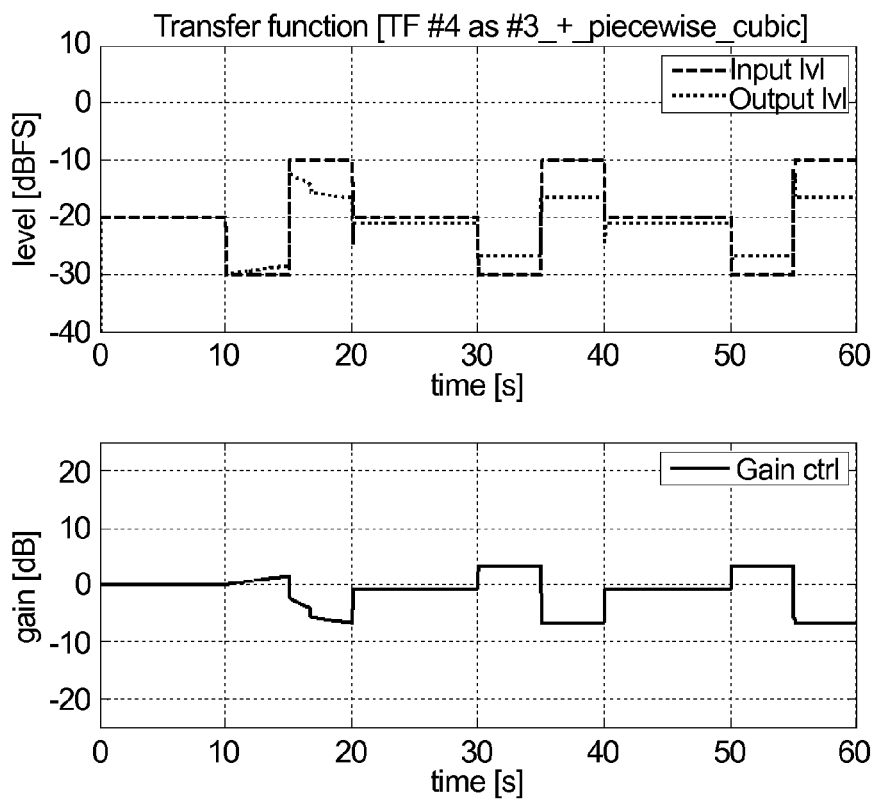

Note the slight differences in the Output level, compared to FIG. 17 (which is identical except for the small delay of the output signal).

Figure 19:
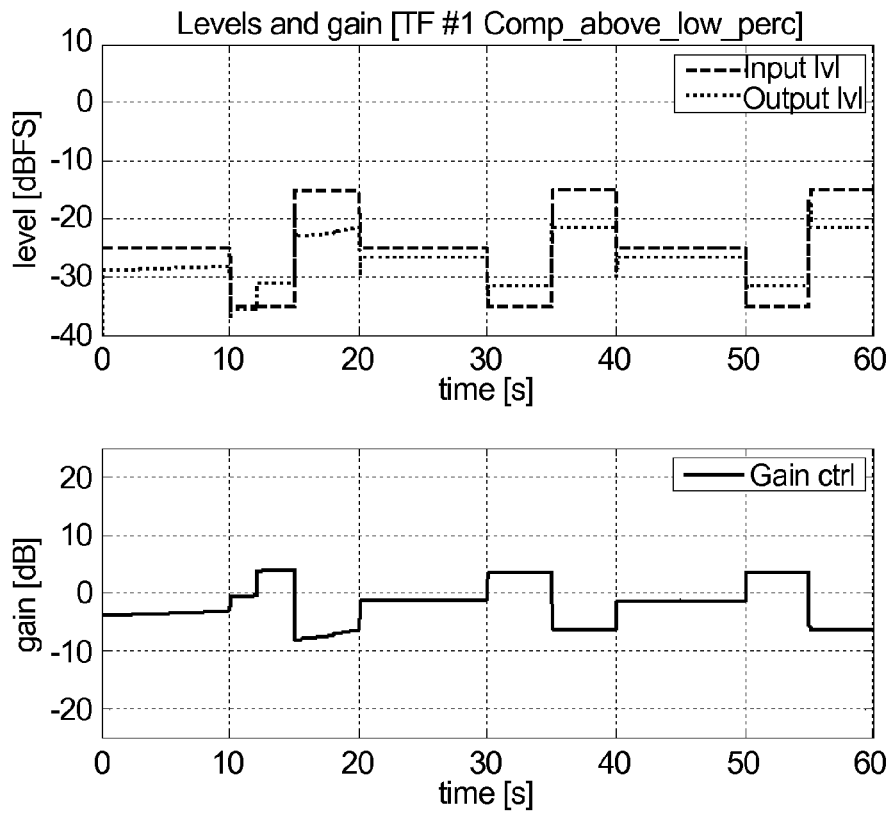
Figure 20:
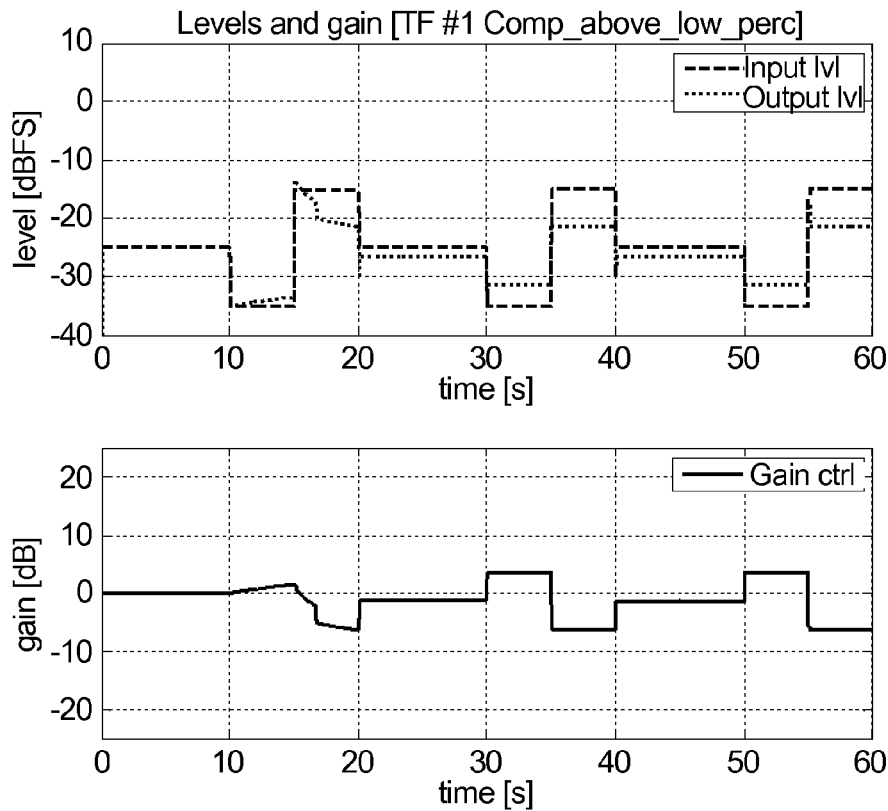

Simulation 8: FIG. 19
Based on the same setup as simulation 2, but this time with the test signal being gained by −5 dB, and with the DA block (205) 'primed' with a preset corresponding to the distribution from the test signal (i.e. at its original gain).
Integrated loudness level: input=−20.2, output=−25.4 (target=−25.0) dBFS
Loudness range: input=20.0, output=10.0 (target=10.0) dB Simulation 9: FIG. 20
Same setup as simulation 8, i.e. based on simulation 2 but with the Test signal being gained by −5 dB.

However, this time the distribution analyzer block was NOT primed.
Integrated loudness level: input=−20.2, output=−24.0 (target=−25.0) dBFS
Loudness range: input=20.0, output=10.0 (target=10.0) dB Note the different time-varying gain and hence output level, compared to FIG. 19.

REFERENCES

EBU (2010) "Recommendation R-128", European Broadcast Union.

ITU-R (2011) "Recommendation BS.1770-2", International Telecommunication Union.

Skovenborg (2012) "Loudness Range (LRA)—Design and Evaluation", AES 132$^{nd}$ Cony.

Vickers (2001) "Automatic Long-term Loudness and Dynamics Matching", AES 111$^{th}$ Conv.

Zölzer (2011) "DAFX: Digital Audio Effects", Wiley.

The invention claimed is:

1. A loudness signal processor for processing an input audio signal in order to control a resulting integrated loudness level and a resulting loudness range of an output audio signal by a predetermined target loudness level and by a predetermined target loudness range, the loudness signal processor comprising
an input arranged to receive an input audio signal;
a level detector block arranged to determine a time-varying level of said input audio signal;
a distribution analyzer block arranged to estimate a time-varying level distribution of said time-varying level;
a transfer function generator block arranged to determine a time-varying transfer function on the basis of said time-varying level distribution, and said predetermined target loudness level and said predetermined target loudness range;
a gain control block arranged to calculate a time-varying gain on the basis of said time-varying level of the input audio signal and said time-varying transfer function;
a multiplier block arranged to apply said time-varying gain to said input audio signal, resulting in said output audio signal,
wherein said transfer function generator block is arranged to determine a loudness level estimated on the basis of said time-varying level distribution by performing an RMS calculation in which the levels below a threshold are excluded, as specified in the calculation of integrated, gated loudness level of ITU-R BS-1770-2 and EBU R-128.

2. The loudness signal processor according to claim 1, wherein said distribution analyzer block is arranged to estimate said time-varying level distribution on the basis of a part of said input audio signal by considering values of said time-varying level corresponding to different times with two or more different weights.

3. The loudness signal processor according to claim 1, wherein said distribution analyzer block is arranged to estimate said time-varying level distribution of said time-varying level by means of a finite-length sliding window.

4. The loudness signal processor according to claim 1, wherein said distribution analyzer block is arranged to estimate said time-varying level distribution of said time-varying level by means of a set of IIR filters.

5. The loudness signal processor according to claim 1, wherein said distribution analyzer block is arranged to estimate the time-varying level distribution of said time-varying level to which said time-varying transfer function has been applied, thus effectively estimate a distribution of a level of said output audio signal.

6. The loudness signal processor according to claim 1, wherein said distribution analyzer block is arranged to maintain at least two instances, one weighing the older time-varying levels lower than the other instance in their respective distribution estimates.

7. The loudness signal processor according to claim 1, wherein an estimated integrated loudness level over a finite-length window of the output audio signal substantially matches said predetermined target loudness level.

8. The loudness signal processor according to claim 1, wherein an estimated integrated loudness level over a finite-length window of the output audio signal is substantially constrained by said predetermined target loudness level.

9. The loudness signal processor according to claim 1, wherein an estimated loudness range over a finite-length window of the output audio signal substantially matches said predetermined target loudness range.

10. The loudness signal processor according to claim 1, wherein an estimated loudness range over a finite-length window of the output audio signal is substantially constrained by said predetermined target loudness range.

11. The loudness signal processor according to claim 1, wherein said predetermined target loudness level is specified as a value of integrated, gated loudness level, as standardized in ITU-R BS.1770-2 and EBU R-128.

12. The loudness signal processor according to claim 1, wherein said predetermined target loudness range is specified as a value of LRA measure, as standardized in EBU Tech. Doc. 3342 and EBU R-128.

13. The loudness signal processor according to claim 1, wherein said level detector block is arranged to determine said time-varying level of said input audio signal by performing RMS calculation of the input audio signal.

14. The loudness signal processor according to claim 1, wherein the time-varying level of said input audio signal corresponds to an estimate of a time-varying loudness level of said input audio signal.

15. The loudness signal processor according to claim 1, wherein said distribution analyzer block is arranged to enable re-initialization.

16. The loudness signal processor according to claim 1, wherein said distribution analyzer block comprises a priming with a predetermined level distribution, the priming being effective immediately.

17. The loudness signal processor according to claim 1, wherein said distribution analyzer block comprises a priming with a predetermined level distribution, the priming being effective at a specific relative or absolute time.

18. The loudness signal processor according to claim 1, wherein said distribution analyzer block comprises a priming with a predetermined level distribution and is arranged to, over time, update the predetermined level distribution based on said time-varying level of the input audio signal.

19. The loudness signal processor according to claim 1, wherein said distribution analyzer block comprises a priming with a predetermined level distribution and is arranged to, over time, update the predetermined level distribution based on said time-varying level of the input audio signal; wherein two or more predetermined level distributions are stored, each being associated with a certain audio signal type; and wherein the distribution analyzer block is arranged to perform the update only for a predetermined level distribution which is associated with an audio signal type corresponding to a type of the input audio signal.

20. The loudness signal processor according to claim 1, wherein said distribution analyzer block comprises a priming with a predetermined level distribution; and wherein the loudness signal processor is arranged to let the predetermined level distribution predominantly affect the target loudness range properties of said time-varying transfer function, and the time-varying level distribution predominantly affect the target loudness level properties of said time-varying transfer function.

21. The loudness signal processor according to claim 1, wherein said distribution analyzer block comprises a priming with a predetermined level distribution which has been generated in advance based on a collection of programs belonging to the same audio signal type that have first been loudness normalized individually, then their time-varying levels measured forming individual level distributions, and then all these distributions combined into the predetermined distribution to be used for priming.

22. The loudness signal processor according to claim 1, wherein a time-delay block is arranged to delay the input audio signal.

23. The loudness signal processor according to claim 3, wherein a length of the finite-length sliding window of said distribution analyzer block is determined by a genre or expected content type of the signal being processed.

24. The loudness signal processor according to claim 3, wherein a length of the finite-length sliding window of said distribution analyzer block is determined corresponding to a duration of a particular program being processed.

25. The loudness signal processor according to claim 1, wherein said transfer function generator block is arranged to maintain an estimate of a distribution of time-varying level of the output audio signal, based on past said time-varying transfer functions combined with past said time-varying level distributions; and wherein the transfer function generator block is further arranged to determine a time-varying transfer function on the basis of said estimate of the distribution of time-varying level of the output audio signal.

26. The loudness signal processor according to claim 1, wherein said transfer function generator block is arranged to determine said time-varying transfer function such that the resulting time-varying gain, for an input audio signal with constant time-varying level, corresponds to the difference between said target loudness level and an estimated integrated loudness level of the input audio signal.

27. The loudness signal processor according to claim 1, wherein said transfer function generator block is arranged to determine a loudness level estimated on the basis of said time-varying level distribution by performing an RMS calculation.

28. The loudness signal processor according to claim 1, wherein said transfer function generator block is arranged to determine a loudness level estimated on the basis of said time-varying level distribution by performing an RMS calculation in which levels below a threshold level are excluded.

29. The loudness signal processor according to claim 1, wherein said transfer function generator block is arranged to determine a loudness level estimated on the basis of said time-varying level distribution by performing an averaging calculation in which higher levels receive a higher weight than lower levels, according to a weighting function.

30. The loudness signal processor according to claim 1, wherein said transfer function generator block is arranged to determine a degree of compression of said time-varying transfer function on the basis of a difference between said target loudness range and a distance between two percentiles estimated on the basis of said time-varying level distribution.

31. The loudness signal processor according to claim 1, wherein said transfer function generator block is arranged to determine a degree of compression of said time-varying transfer function on the basis of a difference between said target loudness range and a distance between two percentiles estimated on the basis of said time-varying level distribution, as specified in the calculation of the LRA measure of EBU Tech. Doc. 3342 and EBU R-128.

32. The loudness signal processor according to claim 1, wherein said transfer function generator block is arranged to determine said time-varying transfer function based on one or more heuristic rules.

33. The loudness signal processor according to claim 1, comprising a preprocessor arranged to preprocess said input audio signal prior to said level detector block.

34. The loudness signal processor according to claim 33, wherein said preprocessor comprises frequency weighting, preferably a filter applied to the input audio signal.

35. The loudness signal processor according to claim 33, wherein said pre-processor comprises an A-, C-, or K-weighting filter.

36. The loudness signal processor according to claim 33, wherein said pre-processor comprises channel weighting, preferably by being arranged to combine a multi-channel input audio signal into a single-channel preprocessed signal.

37. The loudness signal processor according to claim 36, wherein said channel weighting comprises a per-sample power domain sum of channels of said input audio signal.

38. The loudness signal processor according to claim 36, wherein said channel weighting comprises a gain matrix containing a gain coefficient for each individual channel of the input audio signal.

39. The loudness signal processor according to claim 1, comprising a smoothing filter arranged to smooth said time-varying gain such that abrupt changes of said gain would not cause distortion of the output audio signal.

40. Loudness control method for controlling an integrated loudness level and a loudness range of an audio signal on the basis of a predetermined target loudness level and a predetermined target loudness range, the loudness control method comprising:
  receiving said audio signal as an input audio signal;
  determining a time-varying level of said input audio signal;
  estimating a time-varying level distribution of said time-varying level;
  determining a time-varying transfer function on the basis of said time-varying level distribution, and said predetermined target loudness level and said predetermined target loudness range;
  calculating a time-varying gain on the basis of said time-varying level of the input audio signal and said time-varying transfer function; and
  applying said time-varying gain to said input audio signal to establish an output audio signal,
wherein determining a time-varying transfer function on the basis of said time-varying level distribution comprises determining a loudness level estimated on the basis of said time-varying level distribution by performing an RMS calculation in which the levels below a threshold are excluded, as specified in the calculation of integrated, gated loudness level of ITU-R BS-1770-2 and EBU R-128.

41. The loudness control method according to claim 40, wherein said estimating the time-varying level distribution is based on a part of said input audio signal by considering values of said time-varying level corresponding to different times with two or more different weights.

42. The loudness control method according to claim 40, wherein said estimating the time-varying level distribution is performed by means of a finite-length sliding window.

43. The loudness control method according to claim 41, wherein said estimating the time-varying level distribution is performed by means of a set of IIR filters.

* * * * *